United States Patent
Yu et al.

(10) Patent No.: US 12,463,175 B2
(45) Date of Patent: Nov. 4, 2025

(54) BONDING WITH PRE-DEOXIDE PROCESS AND APPARATUS FOR PERFORMING THE SAME

(71) Applicant: Taiwan Semiconductor Manufacturing Co., Ltd., Hsinchu (TW)

(72) Inventors: Chen-Hua Yu, Hsinchu (TW); Ying-Jui Huang, Zhubei (TW); Chih-Hang Tung, Hsinchu (TW); Tung-Liang Shao, Hsinchu (TW); Ching-Hua Hsieh, Hsinchu (TW); Chien Ling Hwang, Hsinchu (TW); Yi-Li Hsiao, Hsinchu (TW); Su-Chun Yang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 639 days.

(21) Appl. No.: 17/664,484

(22) Filed: May 23, 2022

(65) Prior Publication Data

US 2022/0285310 A1    Sep. 8, 2022

Related U.S. Application Data

(62) Division of application No. 16/264,957, filed on Feb. 1, 2019, now Pat. No. 11,342,302.

(Continued)

(51) Int. Cl.
H01L 23/00 (2006.01)
H01L 21/48 (2006.01)
(Continued)

(52) U.S. Cl.
CPC .......... H01L 24/81 (2013.01); H01L 21/4853 (2013.01); H01L 21/4864 (2013.01);
(Continued)

(58) Field of Classification Search
CPC . H01L 24/81; H01L 21/4853; H01L 21/4864; H01L 24/75; H01L 25/50; H01L 21/6838; H01L 2224/7501; H01L 2224/7565; H01L 2224/757; H01L 2224/81013; H01L 2224/81024; H01L 2224/8109; H01L 2224/81091;
(Continued)

(56) References Cited

U.S. PATENT DOCUMENTS

| 4,988,423 A | 1/1991 | Yamamoto et al. |
| 8,449,712 B2 | 5/2013 | Inamoto et al. |

(Continued)

FOREIGN PATENT DOCUMENTS

| CN | 101473707 A | 7/2009 |
| CN | 104520976 A | 4/2015 |

(Continued)

*Primary Examiner* — Thanh T Nguyen
(74) *Attorney, Agent, or Firm* — Slater Matsil, LLP

(57) ABSTRACT

A method includes picking up a first package component, removing an oxide layer on an electrical connector of the first package component, placing the first package component on a second package component after the oxide layer is removed, and bonding the first package component to the second package component.

20 Claims, 21 Drawing Sheets

Related U.S. Application Data

(60) Provisional application No. 62/660,314, filed on Apr. 20, 2018.

(51) Int. Cl.
*H01L 21/683* (2006.01)
*H01L 25/00* (2006.01)

(52) U.S. Cl.
CPC .............. *H01L 24/75* (2013.01); *H01L 25/50* (2013.01); *H01L 21/6838* (2013.01); *H01L 2224/7501* (2013.01); *H01L 2224/7565* (2013.01); *H01L 2224/757* (2013.01); *H01L 2224/81013* (2013.01); *H01L 2224/81024* (2013.01); *H01L 2224/8109* (2013.01); *H01L 2224/81091* (2013.01); *H01L 2224/812* (2013.01); *H01L 2224/81908* (2013.01)

(58) Field of Classification Search
CPC ..... H01L 2224/812; H01L 2224/81908; H01L 24/13; H01L 24/16; H01L 2224/08225; H01L 2224/16111; H01L 2224/32111; H01L 2224/32238; H01L 2224/75745; H01L 2224/83013; H01L 2224/83815; H01L 2224/83895; H01L 21/67028; H01L 21/67132; H01L 21/67144; H01L 24/83; H01L 2224/81424; H01L 2224/81447; H01L 2224/81455; H01L 2224/1181; H01L 2224/16237; H01L 2224/80896; H01L 2224/81011; H01L 2224/81022; H01L 2224/81065; H01L 2224/81075; H01L 2224/81191; H01L 2224/81411; H01L 2224/81815; H01L 2224/8182; H01L 2224/81895; H01L 24/74; H01L 24/80; H01L 2224/80001; H01L 2224/80805; H01L 21/02041; H01L 21/3065; H01L 21/324; H01L 21/52; H01L 21/56; H01L 21/67121; H01L 21/67712; H01J 37/32357; H01J 37/3244; H01J 37/32449; H01J 37/32513; H01J 37/32733; B23K 1/206; B23K 1/0016

See application file for complete search history.

(56) References Cited

U.S. PATENT DOCUMENTS

| | | | |
|---|---|---|---|
| 9,385,024 B2 | 7/2016 | Tong et al. | |
| 9,508,679 B2 | 11/2016 | Ueda et al. | |
| 10,217,637 B1* | 2/2019 | Budd | ...................... H01L 24/94 |
| 10,610,981 B2 | 4/2020 | Hayashi et al. | |
| 2009/0294826 A1* | 12/2009 | Hong | ..................... H10B 41/10 |
| | | | 257/E21.546 |
| 2013/0023118 A1* | 1/2013 | Jeong | ................ H01L 21/31144 |
| | | | 257/E21.586 |
| 2017/0179096 A1* | 6/2017 | Dang | .................. H01L 21/6836 |
| 2018/0001614 A1 | 1/2018 | Bower et al. | |
| 2018/0053911 A1 | 2/2018 | Yoshida et al. | |
| 2019/0009375 A1 | 1/2019 | Hayashi et al. | |
| 2019/0088480 A1 | 3/2019 | Budd et al. | |

FOREIGN PATENT DOCUMENTS

| | | |
|---|---|---|
| DE | 112007001365 T5 | 5/2009 |
| JP | 2010267895 A | 11/2010 |
| JP | 2014032985 A | 2/2014 |
| KR | 101113438 B1 | 2/2012 |
| KR | 20120034786 A | 4/2012 |
| TW | 200807591 A | 2/2008 |
| TW | 201407696 A | 2/2014 |
| TW | 201718163 A | 6/2017 |
| WO | 2015006000 A1 | 1/2015 |
| WO | 2017057651 A1 | 4/2017 |

* cited by examiner

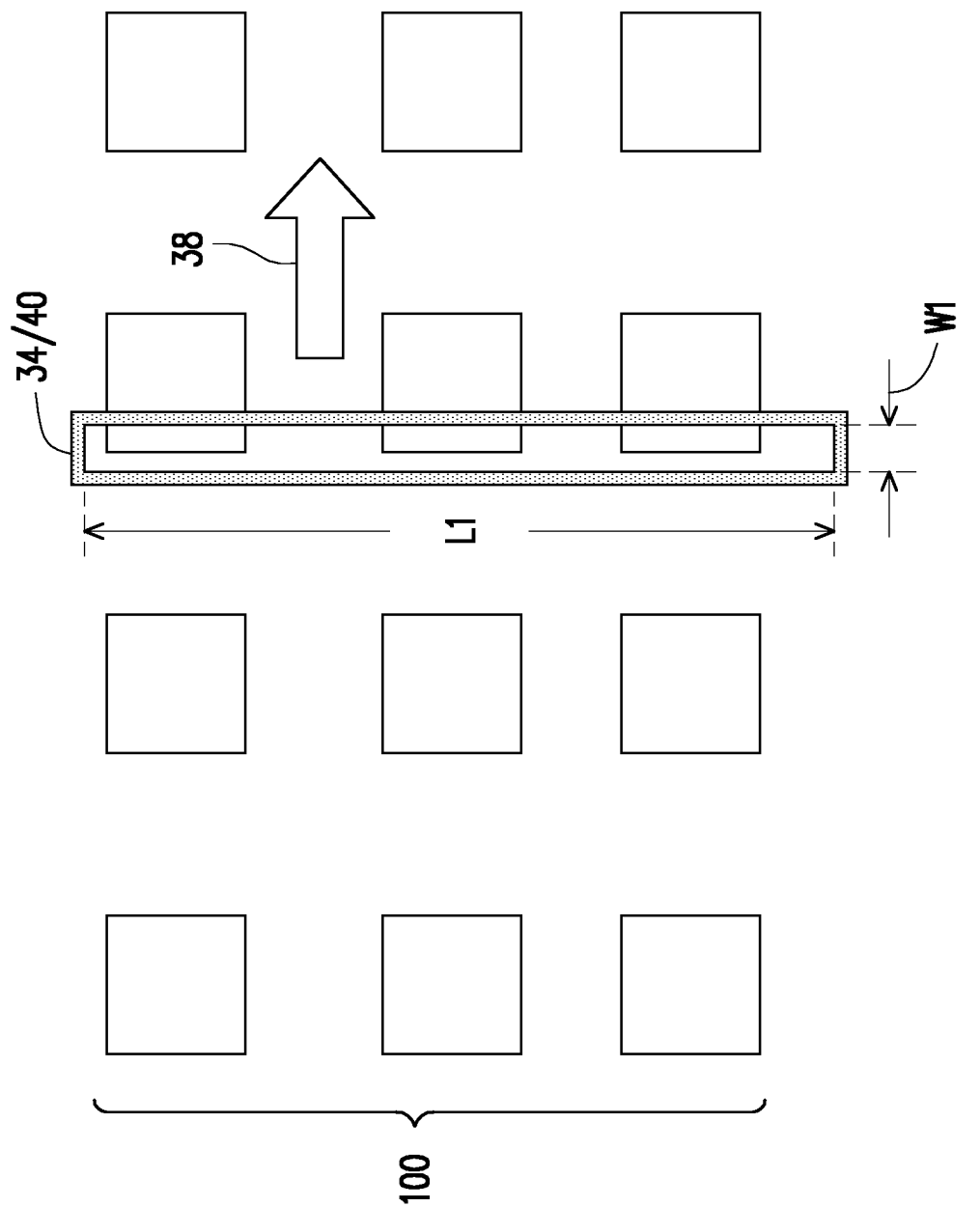

BONDING WITH PRE-DEOXIDE PROCESS AND APPARATUS FOR PERFORMING THE SAME

PRIORITY CLAIM AND CROSS-REFERENCE

This application is a divisional of U.S. patent application Ser. No. 16/264,957, entitled "Boding with Pre-Deoxide Process and Apparatus for Performing the Same," and filed Feb. 1, 2019, which claims the benefit of the U.S. Provisional Application No. 62/660,314, filed on Apr. 20, 2018, and entitled "Bonding with Pre-Deoxide Process and Apparatus for Performing the Same," which applications are hereby incorporated herein by reference.

BACKGROUND

Bonding is a commonly used process for integrating a plurality of pre-formed package components together. In the bonding process, the electrical connectors of a first package component are bonded to the electrical connectors of a second package component to electrically inter-couple the devices in the first and the second package components. In an example of the bonding process, a top die is picked up from a sawed top wafer, and the electrical connectors of the top die are dipped in a de-oxide agent such as flux. The top die is then aligned to a bottom die in a bottom wafer, and is placed on the bottom wafer. The top electrical connectors of the top die are aligned to and placed over the bottom electrical connectors in the bottom die. After a plurality of top dies are placed on the bottom dies, a reflow is performed, so that solder regions on either the top dies or bottom dies are molten. The electrical connectors, before bonding, typically have oxides at the surface. During the reflow, the de-oxide agent removes the oxide on the top and bottom electrical connectors. After the reflow, the de-oxide agent is removed, for example, using a solvent or water.

In another bonding process, after the top dies are placed on the bottom dies, instead of dipping the top electrical connectors, a forming gas such as hydrogen is conducted to the top dies and the bottom dies at the same time the reflow is performed, so that the oxides may be reduced back to metal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 15A and 15B illustrate a cross-sectional view and a top view, respectively, of the intermediate stages in a wafer-form de-oxide process in accordance with some embodiments.

DETAILED DESCRIPTION

Figure 2:
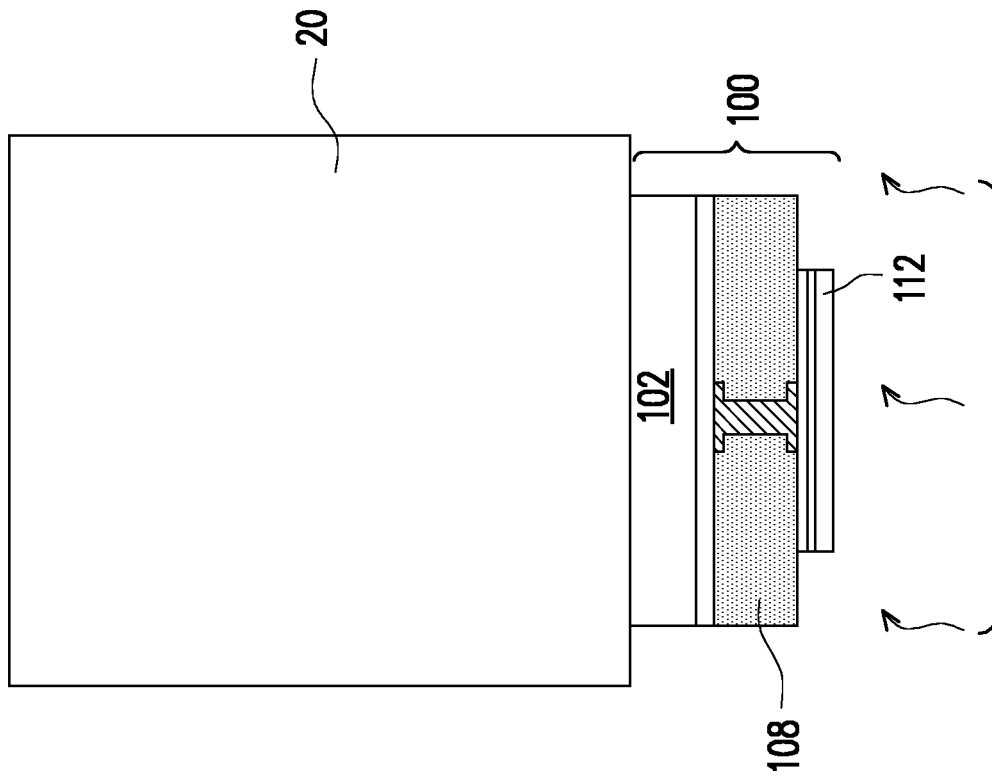
FIGS. 1 through 4 illustrate the cross-sectional views of intermediate stages in a bonding process and the corresponding de-oxide processes in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

De-oxide processes for bonding package components are provided in accordance with some embodiments. The intermediate stages of removing oxide layers on electrical connectors are illustrated in accordance with some embodiments. Some variations of some embodiments are discussed. Throughout the various views and illustrative embodiments, like reference numbers are used to designate like elements. In accordance with some embodiments of the present disclosure, the oxides on electrical connectors of some package components are inline-removed prior to placing (and bonding) the package components onto other package components, rather than removing the oxides using flux or forming gases after the package components are placed in contact with one another. This may solve the problems of removing residue after the bonding processes for some package structure.

Figure 21:
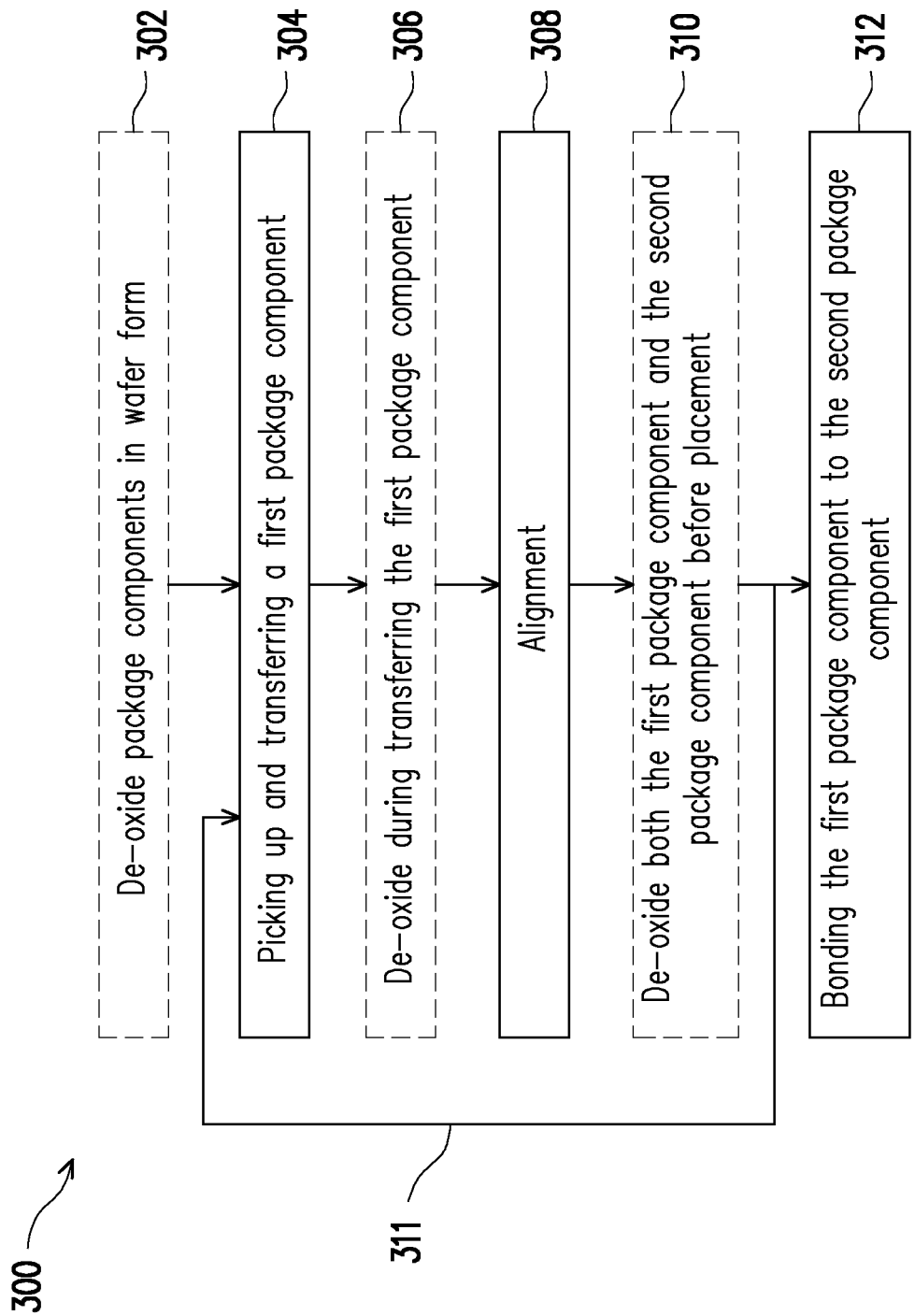
FIG. 21 illustrates a process flow of a bonding process and the corresponding de-oxide processes in accordance with some embodiments.

FIGS. 1 through 4 illustrate the cross-sectional views of intermediate stages in the de-oxide processes and bonding processes of packages in accordance with some embodiments of the present disclosure. The processes shown in FIGS. 1 through 4 are also reflected schematically in the process flow 300 as shown in FIG. 21.

Figure 1:
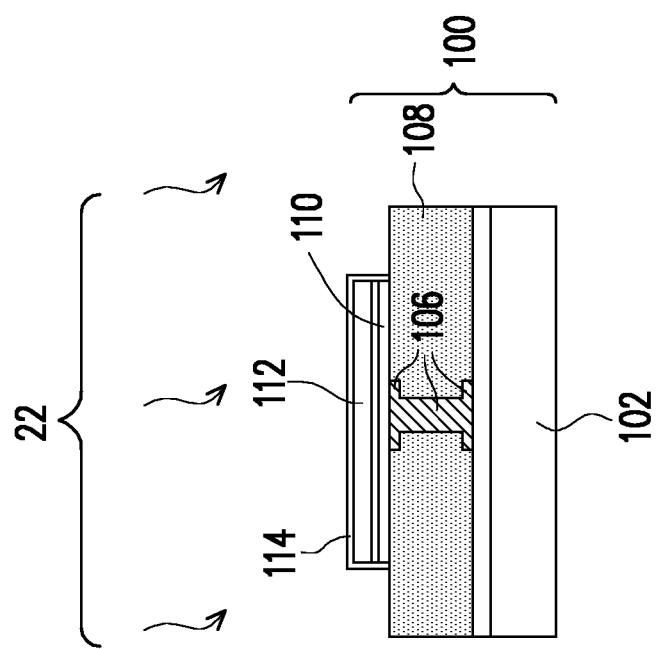

Referring to FIG. 1, a portion of package component 100 is illustrated. Package component 100 may be a device die, a package substrate, an interposer, a package, or the like. In accordance with some embodiments in which package component 100 includes a device die, package component 100 may include semiconductor substrate 102, which may be, for example, a silicon substrate, a silicon germanium substrate, a III-V compound semiconductor substrate, or the like. Active devices (not shown) may be formed at a surface of substrate 102, and may include, for example, transistors, diodes, or the like. Passive devices such as resistors, capacitors, inductors, or the like may also be formed in package component 100. Metal lines and vias 106 are formed in dielectric layers 108, which may include low-k dielectric layers in accordance with some embodiments. Metal lines and vias 106 and dielectric layer 108 are shown schematically. Metal lines and vias 106 interconnect the active devices, and may connect the active devices to the overlying electrical connector 112.

In accordance with alternative embodiments of the present disclosure, package component 100 is an interposer die, which is free from active devices therein. Package component 100 may or may not include passive devices (not shown) such as resistors, capacitors, inductors, transformers, and the like in accordance with some embodiments. In accordance with yet alternative embodiments, package component 100 is a package substrate, which may include a laminate package substrate, in which laminated dielectric layers 108 are formed. Conductive traces 106 (which are schematically illustrated) are embedded in laminated dielectric layers 108. In accordance with alternative embodiments of the present disclosure, package component 100 is a build-up package substrate, which comprises a core (not shown) and conductive traces (represented by 106) built on the opposite sides of the cores. Package component 100 may also include Under-Bump-Metallurgy (UBM) 110, on which electrical connector 112 is formed.

In each of the embodiments wherein package component 100 is a device die, an interposer die, a package substrate, or the like, there is a surface dielectric layer 108 formed at the surface of package component 100. In accordance with some embodiments of the present disclosure, surface dielectric layer 108 is a silicon-containing a dielectric layer, which may comprise silicon oxide, silicon oxynitride (SiON), silicon nitride (SiN), or the like. Electrical connector 112 is formed as a surface feature of package component 100, and electrical connector 112 may be electrically coupled to the active devices through metal lines and vias 106. Electrical connector 112 may also include solder (such as a Sn—Ag—Cu solder or a Sn—Pb solder) or a non-solder metallic material such as copper, aluminum, nickel, tungsten, or alloys thereof. In accordance with some embodiments of the present disclosure, as illustrated, electrical connector 112 protrudes beyond the top surface of the surface dielectric layer 108. In accordance with other embodiments of the present disclosure, the top surface of the surface dielectric layer 108 and the top surface of electrical connector 112 are substantially coplanar with each other. FIG. 1 also illustrates metal oxide layer 114 formed on the surface of electrical connector 112. Metal oxide layer 114 may be the native oxide layer that is formed due to the exposure of electrical connector 112 to open air. Oxide layer 114 may include tin oxide, copper oxide, or the like, depending on the material of electrical connector 112.

In accordance with some embodiments in which package component 100 is a device die, surface dielectric layer 108 and electrical connector 112, which are used for the subsequent bonding, may be on the front side (the side with the active devices) or the back side of substrate 102, although FIG. 1 illustrates that surface dielectric layer 108 and electrical connector 112 are on the front side of substrate 102.

In accordance with some embodiments of the present disclosure, a mass oxide-removal process (represented by arrows 22) is performed to remove oxide layer 114 from package component 100. The respective process is illustrated as process 302 in the process flow shown in FIG. 21. Throughout the description, oxide-removal processes are also referred to as de-oxide processes. The respective process is also shown in a dashed box in FIG. 21 to indicate that this process may be performed or may be skipped. In the mass oxide-removal process, a plurality of discrete package components 100 are placed close to each other, for example, on a template or a dicing tape, and the oxide layers on the plurality of package components 100 are removed in common processes, as will be discussed in subsequent processes. The plurality of discrete package components 100 are spaced apart from each other, and may have identical structures. The mass oxide-removal process is also referred to as a wafer-form de-oxide process since a plurality of package components sawed from a wafer may undertake the same de-oxide process together. The details of the wafer-form de-oxide process are also discussed in subsequent paragraphs and shown in subsequent figures.

FIG. 2 illustrates the pickup and the transfer of package component 100. The respective process is illustrated as process 304 in the process flow shown in FIG. 21. The pickup process and the transfer process may be achieved through vacuum head 20. In accordance with some embodiments of the present disclosure, instead of having the oxide layers removed in a wafer-form de-oxide process, the oxide layers 114 (FIG. 1) may be removed in the die-form and during the transferring of package component 100. The respective process is illustrated as process 306 in the process flow shown in FIG. 21. The respective process is also shown in a dashed box to indicate that this process may be performed or may be skipped. The corresponding de-oxide process (shown by arrows 24 in FIG. 2) is referred to as a die-form de-oxide process since in the de-oxide process, oxide is removed from a single package component 100 rather than from a plurality of package components 100. The details of the die-form de-oxide process are also discussed in subsequent paragraphs and shown in subsequent figures.

Figure 3:
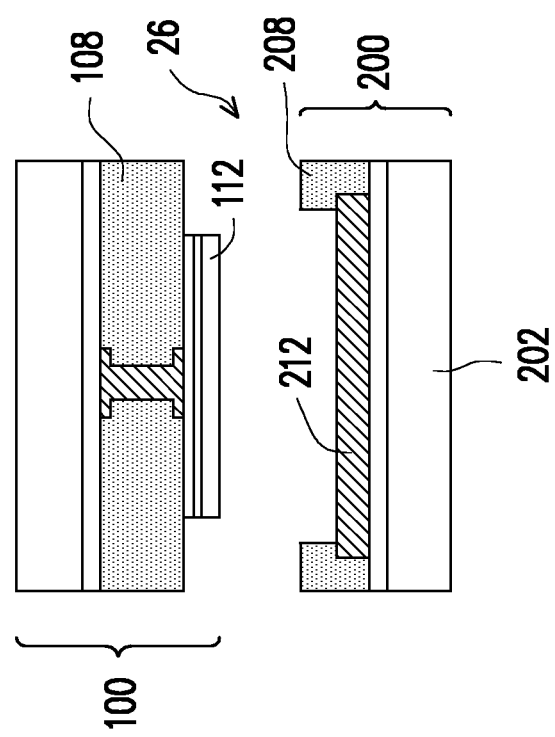

FIG. 3 illustrates the alignment of package component 100 to package component 200. The respective process is illustrated as process 308 in the process flow shown in FIG. 21. Package component 200 may also be selected from a device die, an interposer die, a package substrate, and the like. In accordance with some embodiments of the present disclosure, package component 200 includes substrate 202, surface dielectric layer 208, and metal pad 212. Package component 200 may also include dielectric layers and/or metal lines and vias in the dielectric layers. Package component 200 may include or free from active devices and/or passive devices. For example, package component 200 may have a structure similar to what is described for package component 100, and the details are not repeated herein. In accordance with some embodiments of the present disclosure, as illustrated, electrical connector 212 is recessed from the top surface of surface dielectric layer 208. In accordance with some embodiments of the present disclosure, the top surface of surface dielectric layer 208 and the top surfaces of electrical connector 212 are substantially level with each other.

In accordance with some embodiments of the present disclosure, surface dielectric layer 208 is a silicon-containing dielectric layer, which may comprise silicon oxide, SiON, SiN, or the like. Electrical connector 212 is formed as a surface feature of package component 200 and may be electrically coupled to active devices (if formed) in package component 200. Electrical connector 212 may also include solder (such as a Sn—Ag—Cu solder or a Sn—Pb solder) or a non-solder metallic material such as copper, aluminum, nickel, tungsten, or alloys thereof.

In accordance with some embodiments of the present disclosure, package component 200 is a part of unsawed larger package component such as an unsawed device wafer, an unsawed interposer wafer, an unsawed package substrate strip, or a reconstructed wafer with a plurality of identical device dies packaged therein. In accordance with other embodiments of the present disclosure, package component 200 is a discrete device die, a discrete interposer, a discrete package substrate, or the like. A de-oxide process may be performed to remove the oxide layers on electrical connector 212 prior to the alignment process. The de-oxide process of package component 200 may be performed, for example, using a wet cleaning process or a mass de-oxide process as discussed in the present disclosure.

In accordance with some embodiments of the present disclosure, the oxide layers on both electrical connectors 112 and 212 are removed simultaneously. The respective process is illustrated as process 310 in the process flow shown in FIG. 21. The respective process is also shown in a dashed box to indicate that this process may be performed or may be skipped. The corresponding de-oxide process is also a die-form de-oxide process since oxide is removed from a single package component 100 and a single package component 200 rather than from a plurality of package components 100 and/or 200. The corresponding de-oxide process is represented by arrow 26 in FIG. 3. For example, package component 100 may be placed close to, and still spaced apart from, package component 200. The de-oxide process is then performed, for example, by generating plasma from a forming gas, which may include a mixture of hydrogen ($H_2$) and nitrogen ($N_2$). The plasma is conducted into the gap between package components 100 and 200 to reduce the metal oxide layers on electrical connectors 112 and 212 back to metal. Throughout the description, the terms "reduce" and "reduction" of metal oxides mean that in the reduction, the oxygen bonded with metal to form metal oxides are de-bonded, and the metal atoms become elemental atoms and remain on the surfaces of electrical connectors 112 and 212. As a result of the reduction, the oxygen atoms previously bonded with metal may react with hydrogen to form water ($H_2O$), which is then evacuated.

Figure 4:
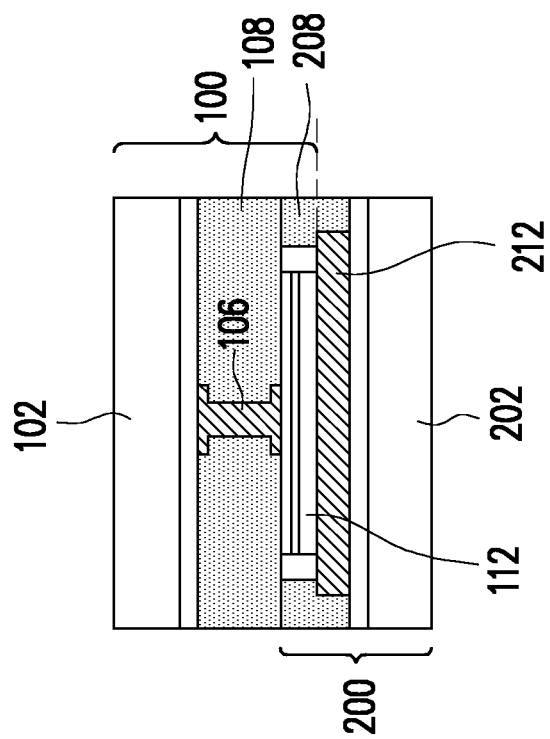

Referring to FIG. 4, package component 100 is placed on package component 200. In accordance with some embodiments of the present disclosure, the processes shown in FIGS. 1 through 3 are repeated, so that a plurality of package components 100 are placed on a plurality of corresponding package components 200. The repetition of the processes is represented by arrow 311 in the process flow as shown in FIG. 21. An anneal process or a reflow process is performed to bond package components 100 to package components 200. The respective processes are shown as process 312 in the process flow show in FIG. 21. The interval between the de-oxide processes 22, 24, and 26 (FIGS. 1 through 3) and the time the bonding occurs is kept short to prevent oxide from being regenerated on the surfaces of electrical connectors 112 and 212. For example, the interval may be in the range between about 1 second and about 5 seconds. Also, during the placement of package component 100, package components 100 and 200 may be located in an environment with at least reduced oxygen and moisture content, which environment may be a vacuum environment, a chamber or room filled with nitrogen, or the like. Alternatively, during the placement of package component 100, package components 100 and 200 are located in open (clean) air.

The bonding may include solder bonding, in which either one or both of electrical connectors 112 and 212 are solder regions, which are reflowed in the bonding process. In accordance with other embodiments, the bonding includes metal-to-metal direct bonding, in which both electrical connectors 112 and 212 are non-solder metal regions, and the bonding is achieved through the inter-diffusion of electrical connectors 112 and 212. In accordance with some embodiments of the present disclosure, surface dielectric layer 108 is bonded to surface dielectric layer 208, for example, through fusion bonding, in which Si—O—Si bonds may be generated to bond surface dielectric layers 108 and 208 together. The respective bonding is thus a hybrid bonding process including both the metal-to-metal (or solder) bonding and the fusion bonding. In accordance with other embodiments, surface dielectric layer 108 is in contact with, and not bonded to, surface dielectric layer 208. In accordance with yet other embodiments of the present disclosure, surface dielectric layer 108 is spaced apart from surface dielectric layer 208 after the bonding.

In the preceding bonding process, oxide can be removed in at least one or more of the three processes 22 (FIG. 1), 24 (FIG. 2), and 26 (FIG. 3). These de-oxide processes are all performed before the bonding of package component 100 to package component 200, and are also performed before package component 100 is placed on package component 200. The removal of oxide before the bonding and the placement has some advantageous features. For example, referring to the bonded package components 100 and 200, after the bonding processes, electrical connectors 112 and 212 are either fully sealed, or the gap for accessing electrical connectors 112 and 212 is very small. If flux is used to remove oxides from electrical connectors 112 and 212, the flux needs to be removed after the bonding, which is either impossible or very difficult since the flux may be sealed or the access channel is too small. In accordance with some embodiments of the present disclosure, the de-oxide process is performed before the bonding, and hence no flux removal process is needed after the bonding process.

Figure 5:
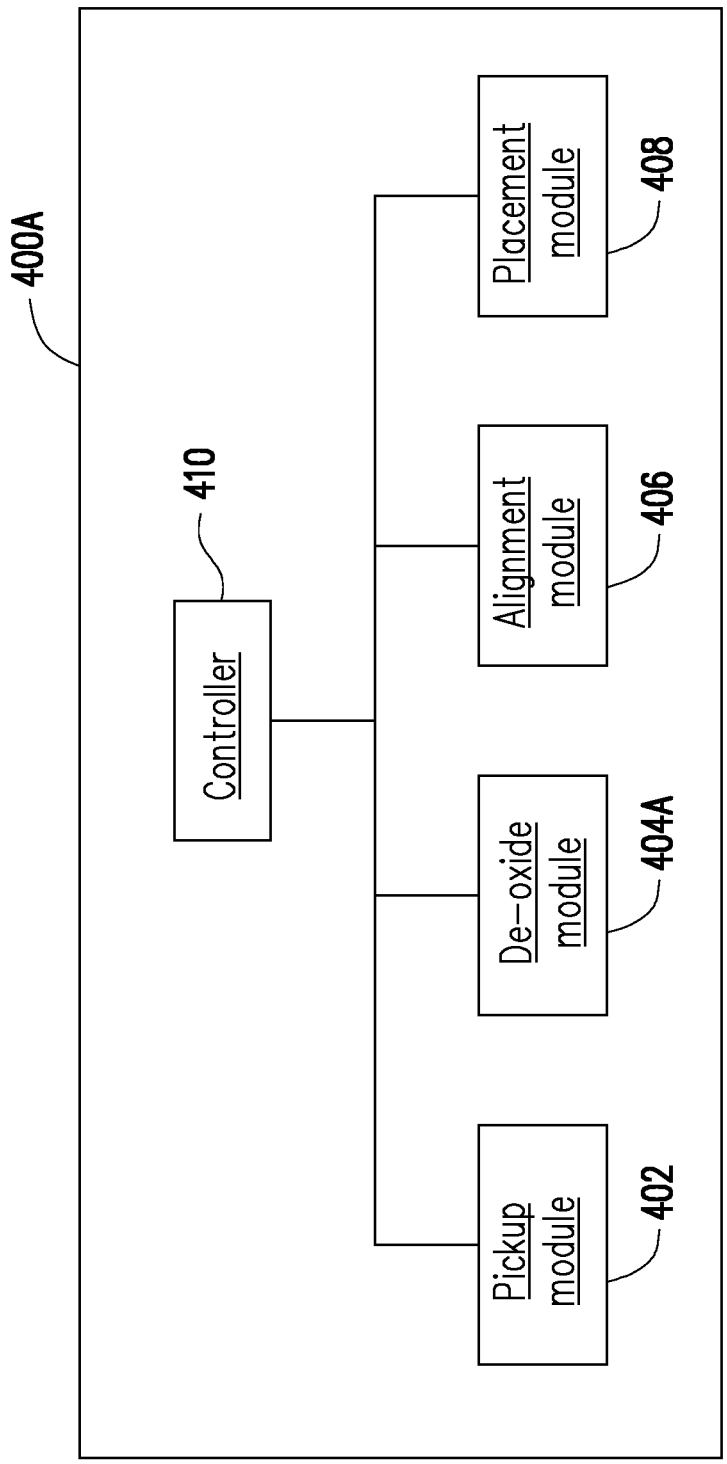
FIG. 5 illustrates the block diagrams of a bonder in accordance with some embodiments.

FIGS. 5 through 21 illustrate the apparatus and the processes for performing the de-oxide processes and the subsequent bonding process in accordance with some embodiments. FIG. 5 illustrates the apparatus for performing the die-form de-oxide process as shown in FIG. 2 in accordance with some embodiments of the present disclosure, and FIGS. 6 through 9 illustrate the cross-sectional views of the corresponding processes.

FIG. 5 illustrates apparatus 400A for performing the bonding process as illustrated in FIGS. 1 through 4. The apparatus 400A is also referred to as a bonder. Bonder 400A is used for performing a de-oxide process from package component 100 (FIG. 2) in die-form, and then bonding the package components. In accordance with some embodiments of the present disclosure, bonder 400A includes pickup module 402, de-oxide module 404A, alignment module 406, and placement module 408. Each of the pickup module 402, de-oxide module 404A, alignment module 406, and placement module 408 includes the corresponding hardware. Also, software may be provided for controlling the hardware. For example, controller 410 (which includes hardware and software) is signally connected to, and is configured to control and coordinate the operations of, pickup module 402, de-oxide module 404A, alignment module 406, placement module 408, and other tools in bonder 400A. Pickup module 402 is used for picking up and transferring package components 100 (FIG. 2), and may be used for flipping package components 100 if needed. De-oxide module 404A is used for removing the oxide from package components. Alignment module 406 is used for aligning (FIG. 3) package components that are to be bonded together. Placement module 408 is used for placing package components 100 onto other package components 200 (FIG. 4).

Figure 6:
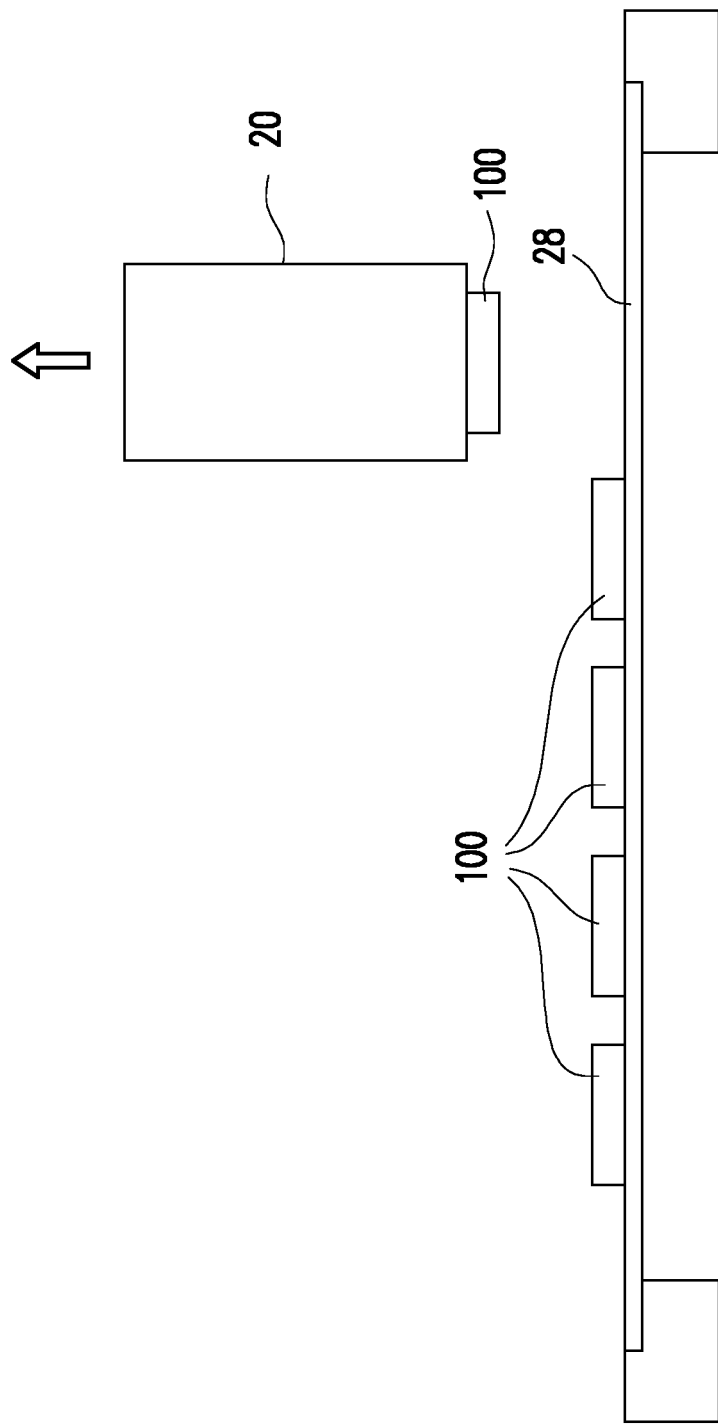
FIGS. 6 through 9 illustrate the cross-sectional views of intermediate stages in a bonding process and the corresponding die-form de-oxide process in accordance with some embodiments.

The operation of components in bonder 400A is discussed in detail referring to the process as shown in FIGS. 6 through 9. It is appreciated that FIGS. 6 through 9 show the same processes as in FIGS. 1 through 4, except that FIGS. 1 through 4 concentrate on the structural details of package components, and FIGS. 6 through 9 concentrate on the details of the de-oxide process. Referring to FIG. 6, a plurality of package components 100 are placed over supporting media 28. In accordance with some embodiments of the present disclosure, supporting media 28 is a dicing tape, on which a wafer is sawed apart into discrete package components 100. In accordance with alternative embodiments of the present disclosure, supporting media 28 is a template, and package components 100 are sawed on a dicing tape, and then placed on the template for the pick-and-place process.

Figure 7:
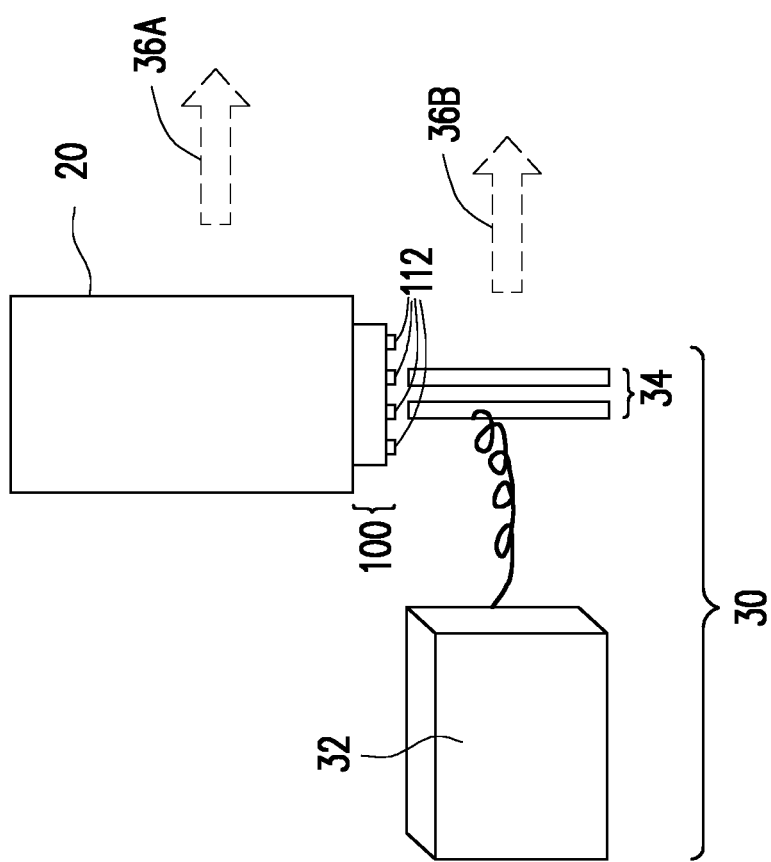

Pickup module 402 (FIG. 5) is configured to pick up package component 100 in FIG. 6. Pickup module 402 may include pickup head 20 (FIG. 6), which may be a vacuum head in accordance with some embodiments. One of package components 100 is picked up by pickup head 20. Next, referring to FIG. 7, a de-oxide process is performed on the package component 100 that has been picked up. FIG. 7 schematically illustrates electrical connectors 112, which are exposed during the transfer of package component 100.

Plasma generator 30, which is comprised in de-oxide module 404A in FIG. 5, is schematically illustrated. Plasma generator 30 may include Radio Frequency (RF) power generator 32, forming gas source(s) (tanks) (not shown), and plasma output device 34. In accordance with some embodiments of the present disclosure, plasma output device 34 includes electrodes that are connected to and receive RF power from RF power generator 32. The forming gas, which may include $H_2$ and $N_2$ in accordance with some embodiments, may be conducted between the electrodes, which generate plasma from the forming gas. The Plasma is blown out to package component 100 to reduce the metal oxide on package component 100 back to metal. In accordance with some embodiments of the present disclosure, the de-oxide process is performed for a duration in the range between about 100 millisecond and about 5 seconds. The plasma may be atmosphere plasma, which is generated under the pressure of one atmosphere.

It is appreciated that the plasma generator 30 as illustrated is merely an example, and other types of plasma generators using different plasma-generating mechanisms may also be used. For example, plasma generator 30 may be a remote plasma generator, which generates the plasma in a location not immediately next to package component 100, and the remote plasma is conducted to package component 100.

Figure 8:
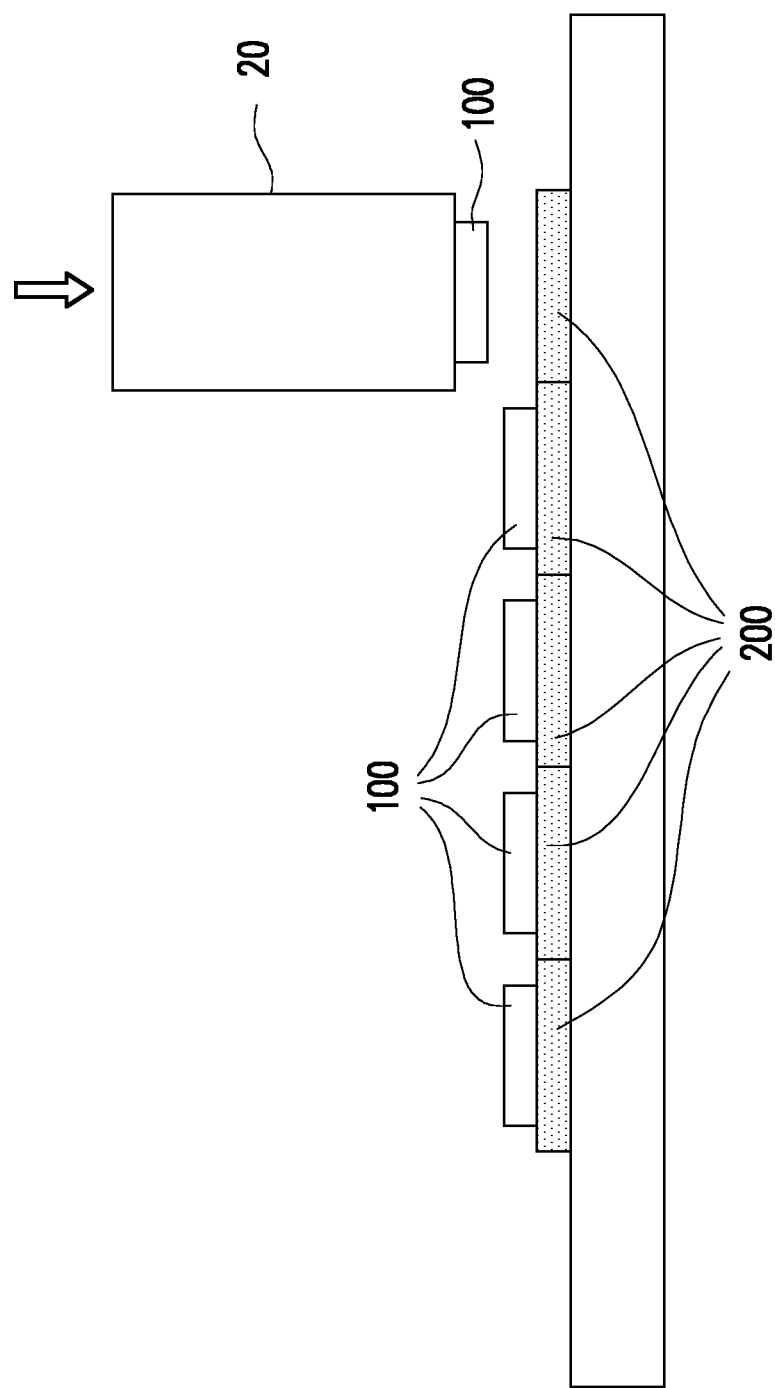

In accordance with some embodiments of the present disclosure, the plasma output device 34 is fixed at a location between supporting media 28 (FIG. 6) and package components 200 (FIG. 8). The package component 100 picked by the pickup head 20 is moved toward plasma output device 34, and parked in alignment with plasma output device 34. The de-oxide process is then performed while the package component 100 is aligned with the plasma output device 34. After the de-oxide process, package component 100 is transferred again to package component 200 (FIG. 8). In accordance with alternative embodiments, plasma output device 34 is movable. During the transferring of package component 100, vacuum head 20 and plasma output device 34 are moved in the same direction (as represented by arrows 36A and 36B), with the movement being synchronized, so that at the same time package component 100 is transferred, the de-oxide process is performed. This improves the throughput of the de-oxide process.

FIG. 8 illustrates the alignment of package component 100 to package component 200. The alignment is performed by alignment module 406 as shown in FIG. 5. As shown in detail as in FIG. 3, the electrical connectors (such as 112 in FIG. 4) of package components 100 are aligned to electrical connectors 212 in package components 200. Package component 100 is then placed on package component 200 by placement module 408 (FIG. 5). The processes as shown in FIGS. 6 through 8 are repeated for each of package components 100.

Figure 9:
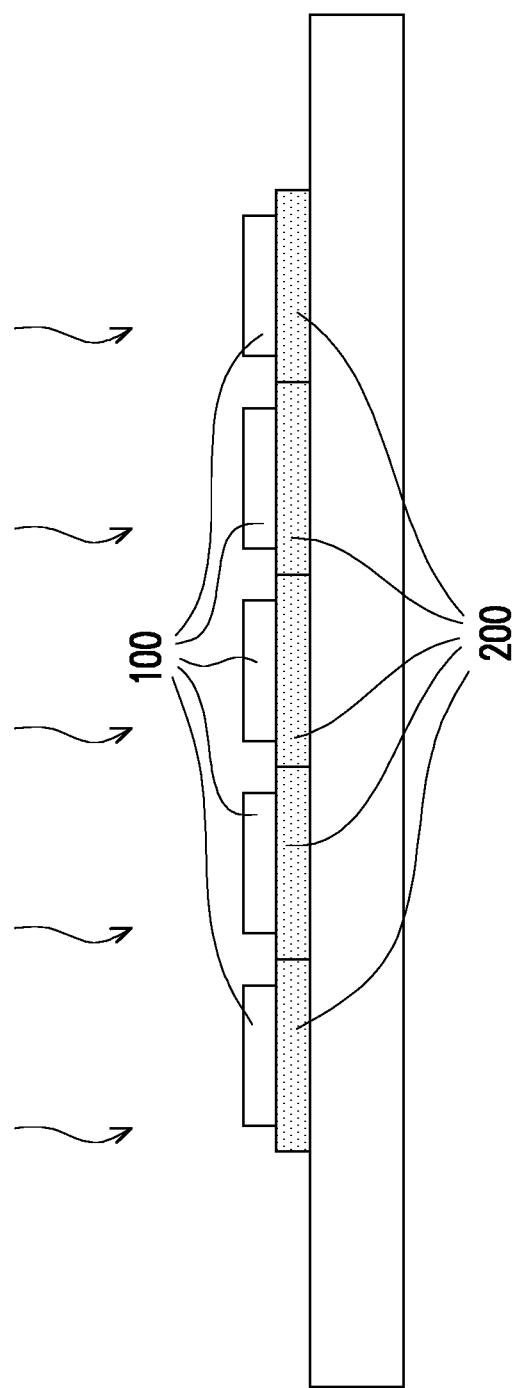

A bonding process is then performed, as shown in FIG. 9. Depending on the intended type of bonding, the bonding process may adopt appropriate time and temperature to reflow solder regions (if any), or to bring about inter-diffusion between electrical connectors 112 and 212.

Figure 10:
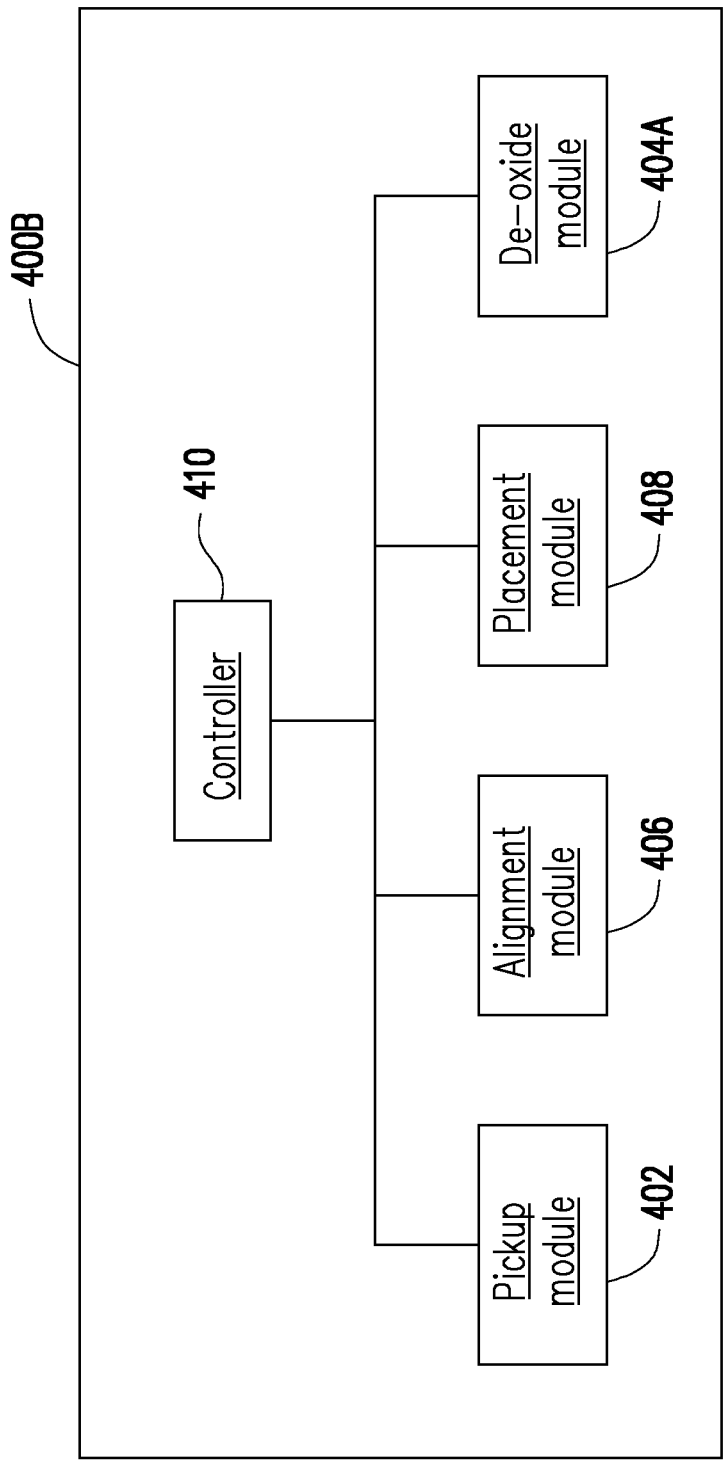
FIG. 10 illustrates the block diagrams of a bonder in accordance with some embodiments.
Figure 11:
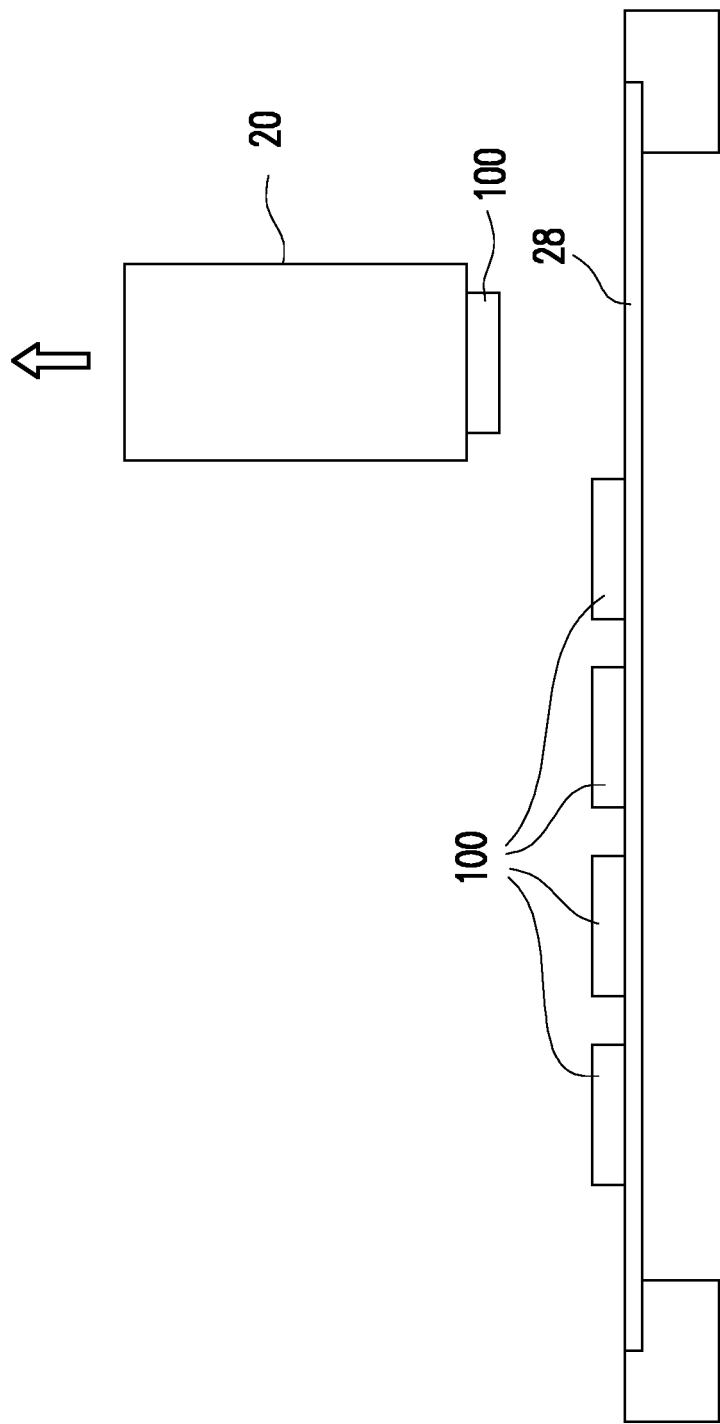
FIGS. 11 through 13 illustrate the cross-sectional views of the intermediate stages in a bonding process and the corresponding die-form de-oxide process in accordance with some embodiments.
Figure 12:
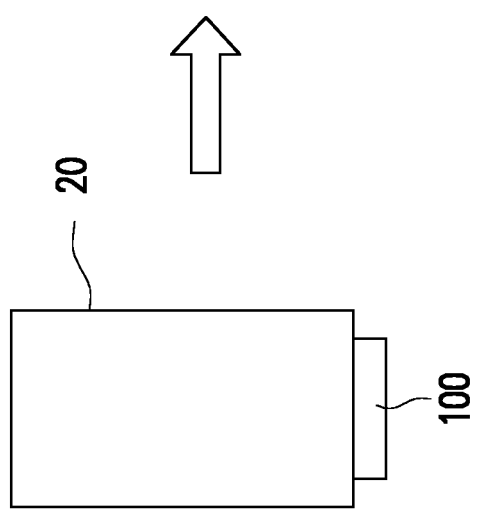
Figure 13:
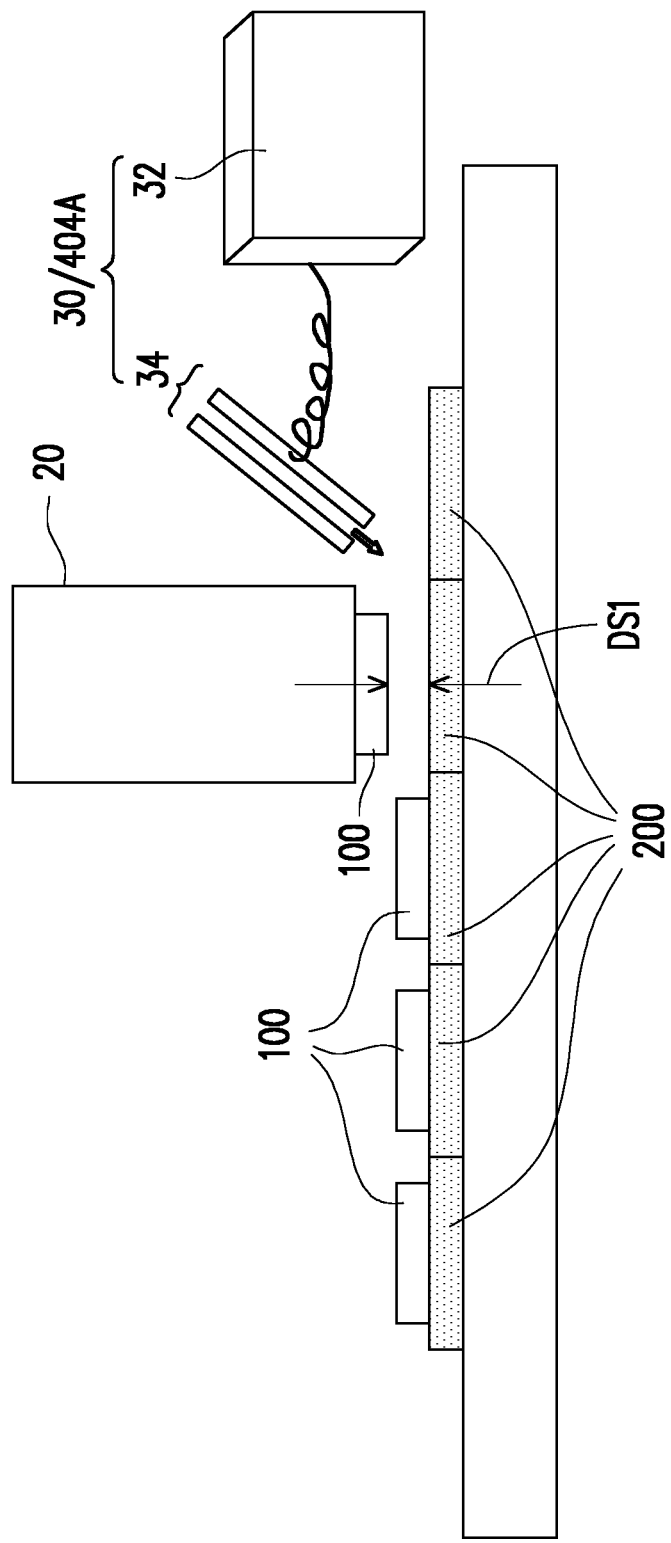

FIG. 10 illustrates the block diagram of bonder 400B for performing the die-form de-oxide process as shown in FIG. 3 in accordance with some embodiments of the present disclosure, and FIGS. 11 through 13 illustrate the cross-sectional views of the corresponding processes. Bonder 400B is used for performing a die-form oxide-removal process for both package components 100 and 200, and then bonding package components 100 to package components 200. In accordance with some embodiments of the present disclosure, bonder 400B includes pickup module 402, alignment module 406, placement module 408, and de-oxide module 404A. Controller 410 is connected to, and is configured to control and coordinate the operations of, pickup module 402, alignment module 406, placement module 408, de-oxide module 404A, and other tools in bonder 400B. The functions of pickup module 402, alignment module 406, placement module 408, and de-oxide module 404A are discussed referring to the processes shown in FIGS. 11, 12, and 13.

Referring to FIG. 11, package components 100 are placed on supporting media 28. Pickup module 402 (FIG. 10), which may include vacuum head 20 as in FIG. 11, is used to pickup package components 100 one-by-one and transfer package component 100 to package component 200. FIG. 12 schematically illustrates the transferring of package component 100.

FIG. 13 illustrates the alignment and the de-oxide process. The alignment of package component 100 to package component 200 is conducted by alignment module 406 as shown in FIG. 10. The de-oxide process is conducted by de-oxide module 404A as shown in FIG. 10. De-oxide module 404A includes plasma generator 30, which may include plasma output device 34. In accordance with some embodiments of the present disclosure, package component 100 is held at a short distance DS1 from package component 200. Distance DS1 is small to improve the efficiency in the de-oxide process. For example, distance DS1 may be in the range between about 1 mm and about 5 mm. Plasma output device 34 is aimed at the gap between package components 100 and 200. With package component 100 being held over package component 200, the plasma generated from the forming gas is blown into the gap, so that the metal oxides on the electrical connectors of package components 100 and 200 are reduced back to metal. The plasma may be atmosphere plasma, which is generated under the pressure of one atmosphere. In accordance with some embodiments of the present disclosure, the de-oxide process is performed for a duration in the range between about 100 millisecond and about 5 seconds.

In accordance with some embodiments of the present disclosure, the de-oxide process is performed before aligning package component 100 to package component 200. In accordance with alternative embodiments of the present disclosure, the de-oxide process is performed after aligning package component 100 to package component 200. The de-oxide process may also be performed at the same time package component 100 is being aligned to package component 200. In accordance with other embodiments, the de-oxide process may include any combination of the periods of time before, during, and after the alignment. Package component 100 is then placed on package component 200 by placement module 408 (FIG. 10). A bonding process is then performed. Depending on the intended type of bonding, the bonding process may adopt appropriate time and temperature to reflow solder regions (if any), or to incur inter-diffusion between electrical connectors 112 and 212. The resulting structure is shown in FIG. 9, and hence the details are not discussed herein.

In accordance with some embodiments of the present disclosure, during the transferring (FIG. 12) of package component 100, no de-oxide process is performed. In accordance with other embodiments of the present disclosure, the de-oxide process is performed both during the transferring process as shown in FIG. 12, and in the step as shown FIG. 13. Accordingly, plasma output device 34 may move along with package component 100 similar to what is shown in FIG. 7, and then is stopped at the position shown in FIG. 13 to further conduct the de-oxide process. This may improve the throughput of the bonding process.

Figure 14:
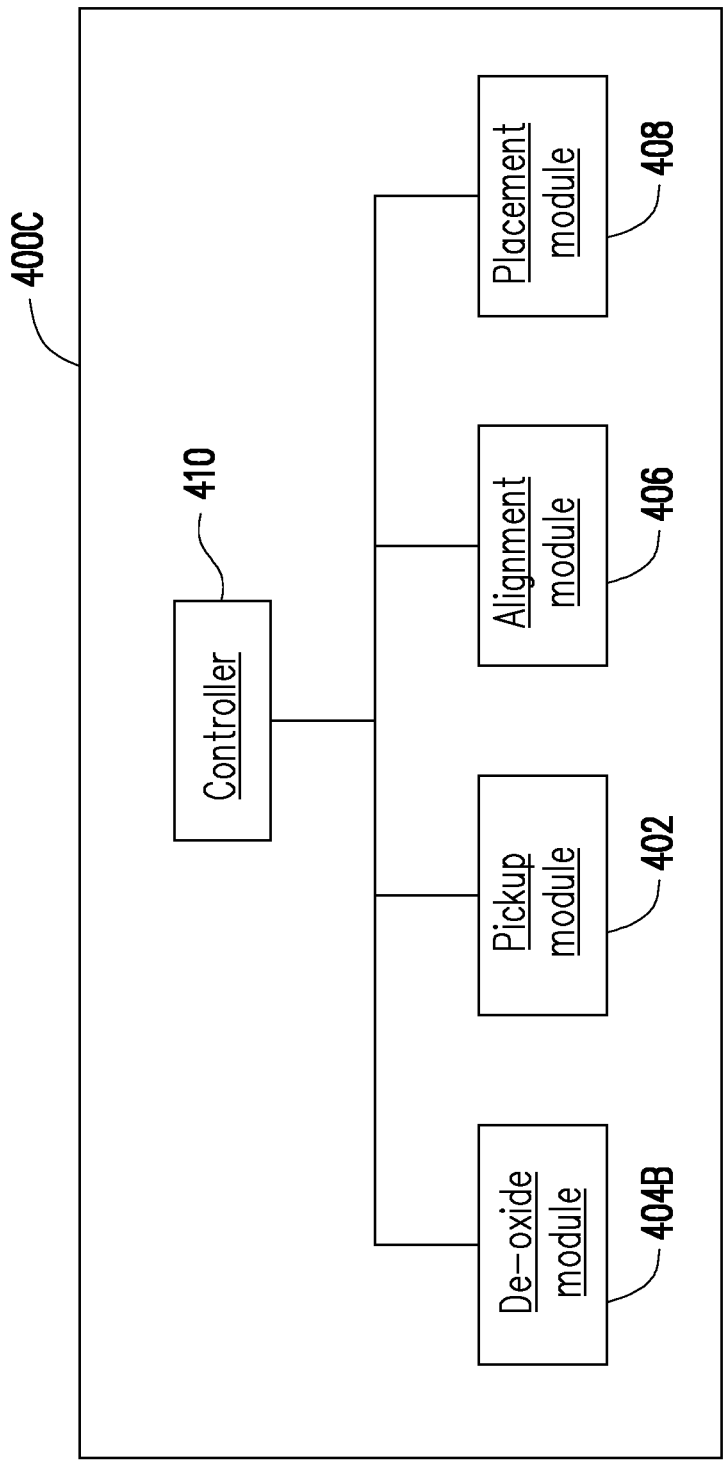
FIG. 14 illustrates the block diagrams of a bonder in accordance with some embodiments.

FIG. 14 illustrates the block diagram of bonder 400C for performing the wafer-form de-oxide process 22 (FIG. 1) in accordance with some embodiments. Bonder 400C is used for performing the wafer-form oxide-removal process for package components 100, and then bonding the package components. In accordance with some embodiments of the present disclosure, bonder 400C includes de-oxide module 404B, pickup module 402, alignment module 406, and placement module 408. Controller 410 is connected to, and is configured to control and coordinate the operation of, de-oxide module 404B, pickup module 402, alignment module 406, placement module 408, and other tools in bonder 400.

Figure 15A:
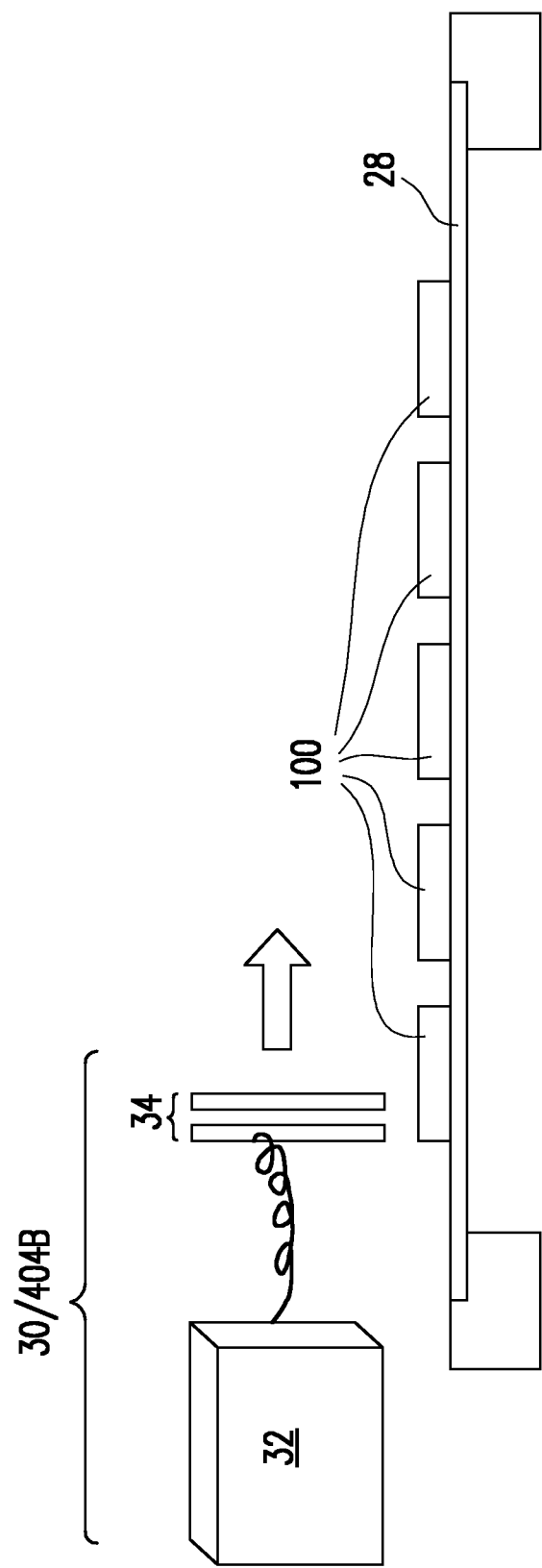

FIGS. 15A and 15B illustrate the cross-sectional view and top view, respectively, of a wafer-form de-oxide process in accordance with some embodiments. The respective process is illustrated as process 302 as shown in FIG. 21 and by arrows 22 in FIG. 1. In the wafer-form oxide-removal process, the oxides on the electrical connectors of a plurality of package components 100 are removed in the same process. In accordance with some embodiments of the present disclosure, de-oxide module 404B (FIG. 14) includes plasma generator 30, which may further include RF generator 32 and plasma output device 34. The plasma may be atmosphere plasma, which is generated under the pressure of one atmosphere. Package components 100 are located on supporting media 28 (FIG. 15A), and may be aligned into an array including a plurality of rows and columns. The outlet of plasma output device 34 may be an elongated slot that extends on one or a plurality of package components 100. For example, FIG. 15B illustrates a top view of a portion of plasma output device 34 in accordance with some embodiments. The illustrated plasma output device 34 may have an elongated outlet. For example, the width W1 of the outlet may be in the range between about 0.5 mm and about 2 mm. The length L1 of the outlet may be in the range between about 10 mm and about 40 mm. Arrow 38 represents the movement of plasma output device 34. With the movement of plasma output device 34, package components 100 are scanned, with the corresponding electrical connectors de-oxidized. Plasma output device 34 may scan line-by-line to cover all of the package components 100 on supporting media 28.

Figure 16A:
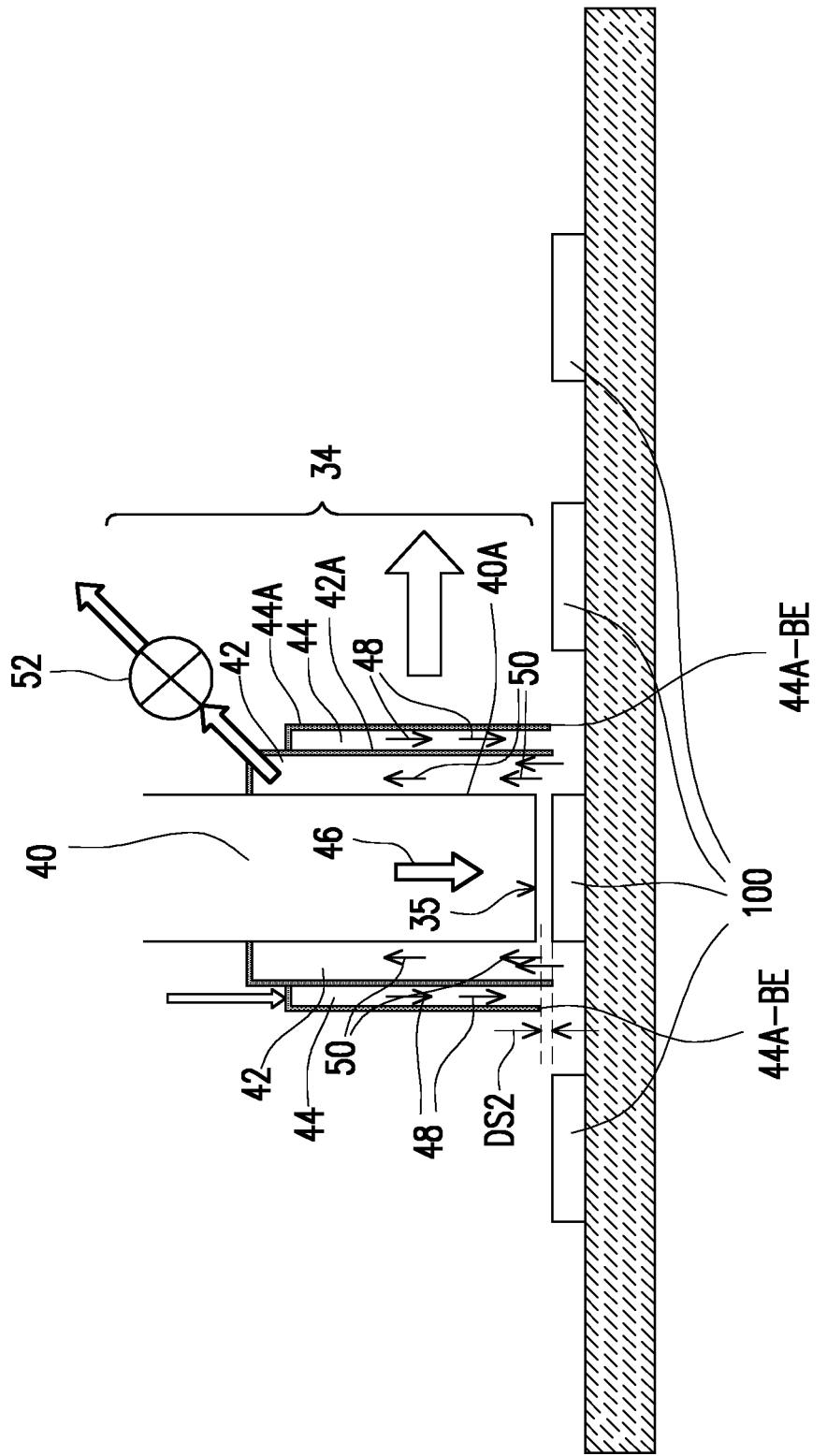
FIGS. 16A and 16B illustrate a cross-sectional view and a top view, respectively, of the intermediate stages in a wafer-form de-oxide process in accordance with some embodiments.
Figure 16B:
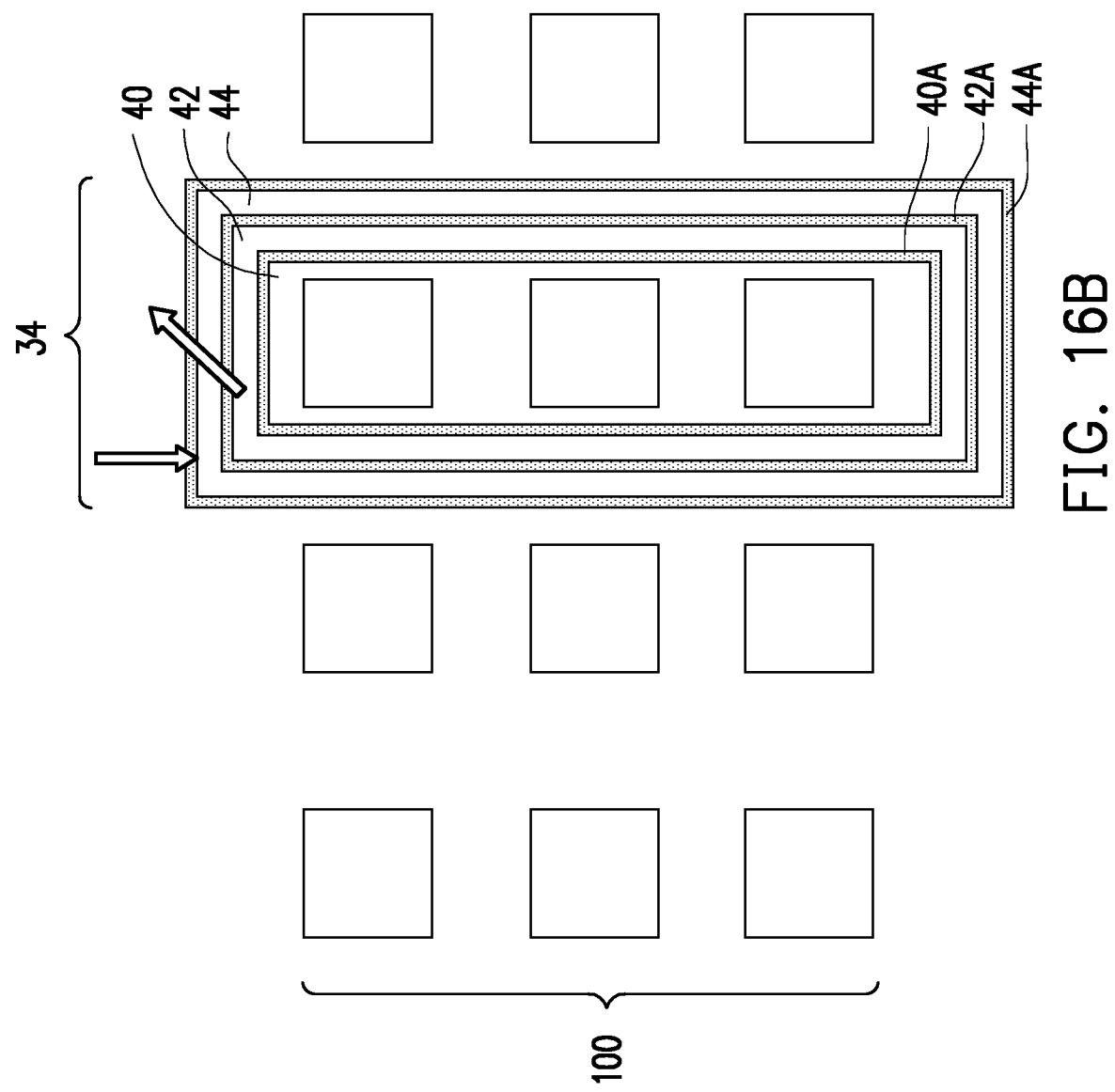

FIGS. 16A and 16B illustrate a cross-sectional view and a top view, respectively, of plasma output device 34 as well as the corresponding de-oxide process in accordance with some embodiments. The respective de-oxide process is also illustrated as process 302 as shown in FIG. 21 and by arrows 22 in FIG. 1. Plasma output device 34 may be a part of the de-oxide module 404B as shown in FIG. 15. Referring to FIG. 16B, plasma channel 40 is used for outputting the plasma. Exhaust channel 42 is formed on the outer side of plasma channel 40. Exhaust channel 42 may form a full ring encircling plasma channel 40. On the outer side of exhaust channel 42 is inert gas channel 44. Inert gas channel 44 may form a full ring encircling exhaust channel 42. Channels 40, 42, and 44 are separated from each other. A first sidewall 40A, which may be a first ring in the top view, defines plasma channel 40. A second sidewall 42A, which may form a second ring in the top view, defines exhaust channel 42 along with the first sidewall 40A. A third sidewall 44A, which may form a third ring in the top view, defines inert gas channel 44 along with the second sidewall 42A.

FIG. 16A illustrates the cross-sectional view of the process as shown in FIG. 16B. The plasma (represented by arrow 46) for reducing the metal oxide is conducted toward package component 100. Inert gas channel 44 is used to conduct an inert gas such as nitrogen, argon, or the like. The inner gas is represented by arrow 48. The inert gas 48 acts as a barrier for the plasma and the corresponding forming gas, so that the forming gas does not escape to the outside environment. Exhaust channel 42 is used to recycle the inert gas and the forming gas, which are represented by arrows 50. For example, pump 52 may be connected to the outlet of exhaust channel 42 to pump gases 50 out.

In accordance with some embodiments of the present disclosure, outer sidewall 44A has bottom edge 44A-BE at a level slightly higher than the top surfaces of package components 100. Sidewalls 40A and 42A also have bottom ends higher than the top surface of package components 100. Accordingly, plasma output device 34 may scan through package components 100 without having to go up and down. The vertical distance DS2 between bottom end 44A-BE and the top surface of package components 100 may be smaller than about 2 mm, and may be in the range between about 1 mm and about 2 mm. In accordance with alternative embodiments of the present disclosure, bottom ends 44A-BE of outer sidewall 44A are lower than the top surfaces of package components 100. Accordingly, as shown in FIG. 16B, inert gas channel 44 is sized and shaped to receive at least one, and possibly more package components 100 therein. In the corresponding de-oxide process, plasma output device 34 is moved over some package components 100, and is then lowered until the bottom edge 44A-BE is lower than the top surfaces of the corresponding package components 100 so that the package components 100 are received within the inert gas channel 44. The de-oxide process is then performed on the corresponding package components. After the de-oxide process is finished. Plasma output device 34 is raised, and then moved to the neighboring package components 100 to perform the de-oxide process. This process is repeated until all of the package components are de-oxidized. The de-oxide process as shown in FIGS. 16A and 16B may be performed in an environment with a pressure of one atmosphere.

Figure 17:
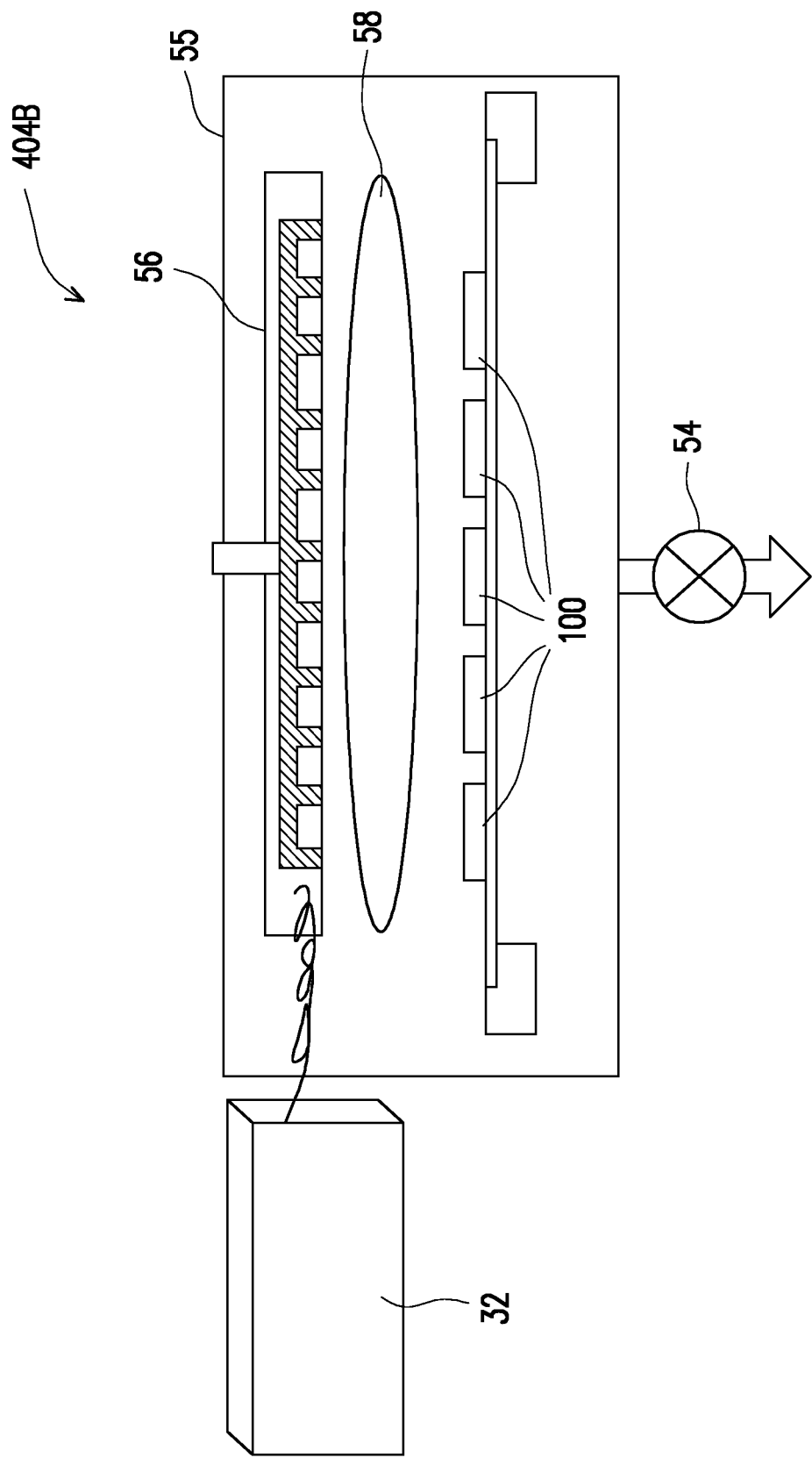
FIGS. 17 through 20 illustrate the cross-sectional views of the intermediate stages in some wafer-form de-oxide processes in accordance with some embodiments.

FIG. 17 illustrates a cross-sectional view of a wafer-form de-oxide process in accordance with some embodiments. The respective de-oxide process is also illustrated as process 302 as shown in FIG. 21 and by arrows 22 in FIG. 1. This process may be performed by generating plasma 58 in vacuum, which vacuum is generated by pump 54. The de-oxide process is performed in chamber 55, which may have a pressure lower than about 10 mTorr. Shower head 56 is used to output plasma 58, which is generated by RF generator 32 using a forming gas, for example. Shower head 56 and RF generator 32 may be the parts of the de-oxide module 404B as shown in FIG. 15. The electrical connectors in a plurality of package components 100 are de-oxidized simultaneously by plasma 58. In accordance with some embodiments of the present disclosure, the duration of the de-oxide process is in the range between about 1 second to 10 seconds.

Figure 18:
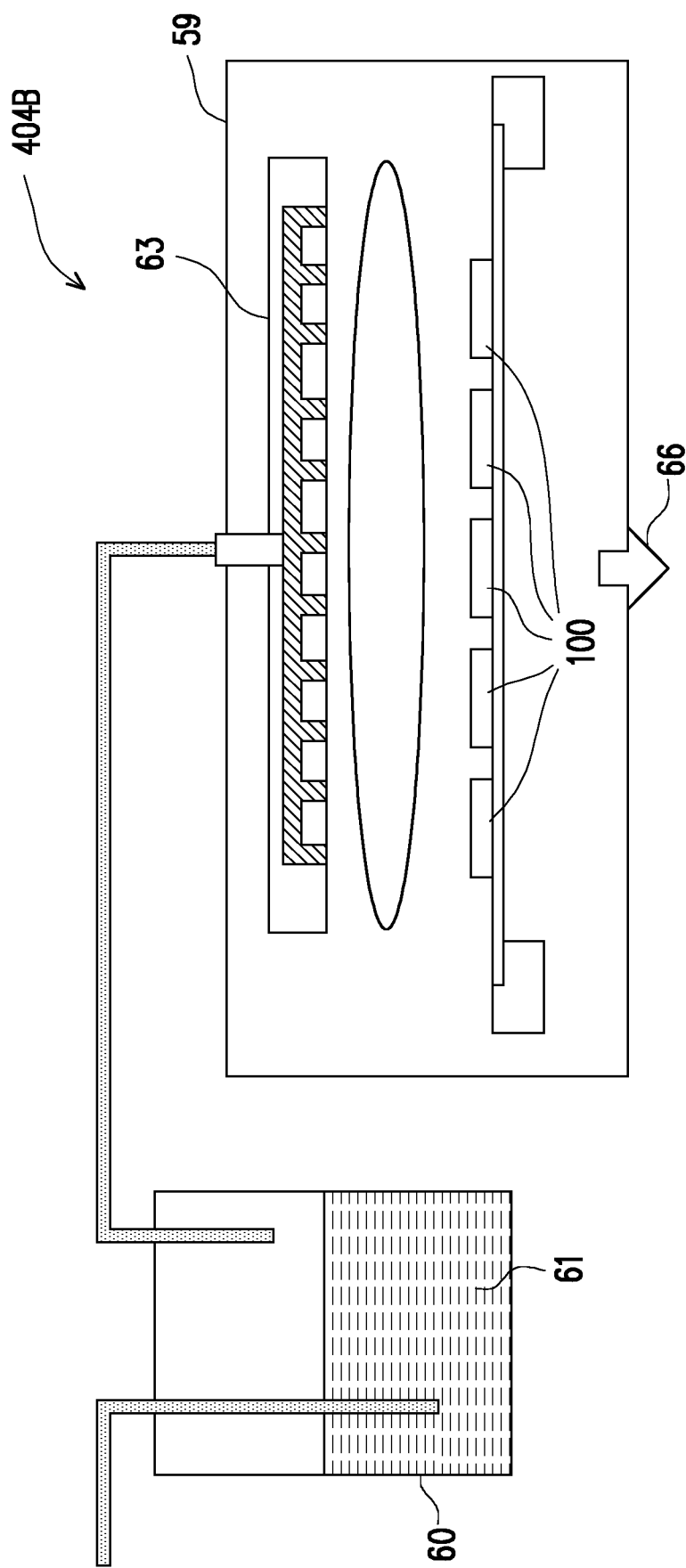

FIG. 18 illustrates a cross-sectional view of a wafer-form de-oxide process and the corresponding de-oxide module 404B in accordance with some embodiments. The respective de-oxide process is also illustrated as process 302 as shown in FIG. 21 and by arrows 22 in FIG. 1. This process may be performed through conducting vapor-phase reductant (such as citric acid) or a forming gas into chamber 59. Chamber 59 is maintained under a pressure slightly lower than one atmosphere. For example, the pressure in chamber 59 is lower than about 0.9 atmospheres. The gases in chamber 59 may be exhausted through channel 66. When the vapor-phase reductant is used, bubbler 60 may be used to generate the vapor-phase reductant from a liquid-phase reductant 61. The vapor-phase reductant or the forming gas may be conducted through shower head 63 to reduce the oxide in package components 100 back to metal.

Figure 19:
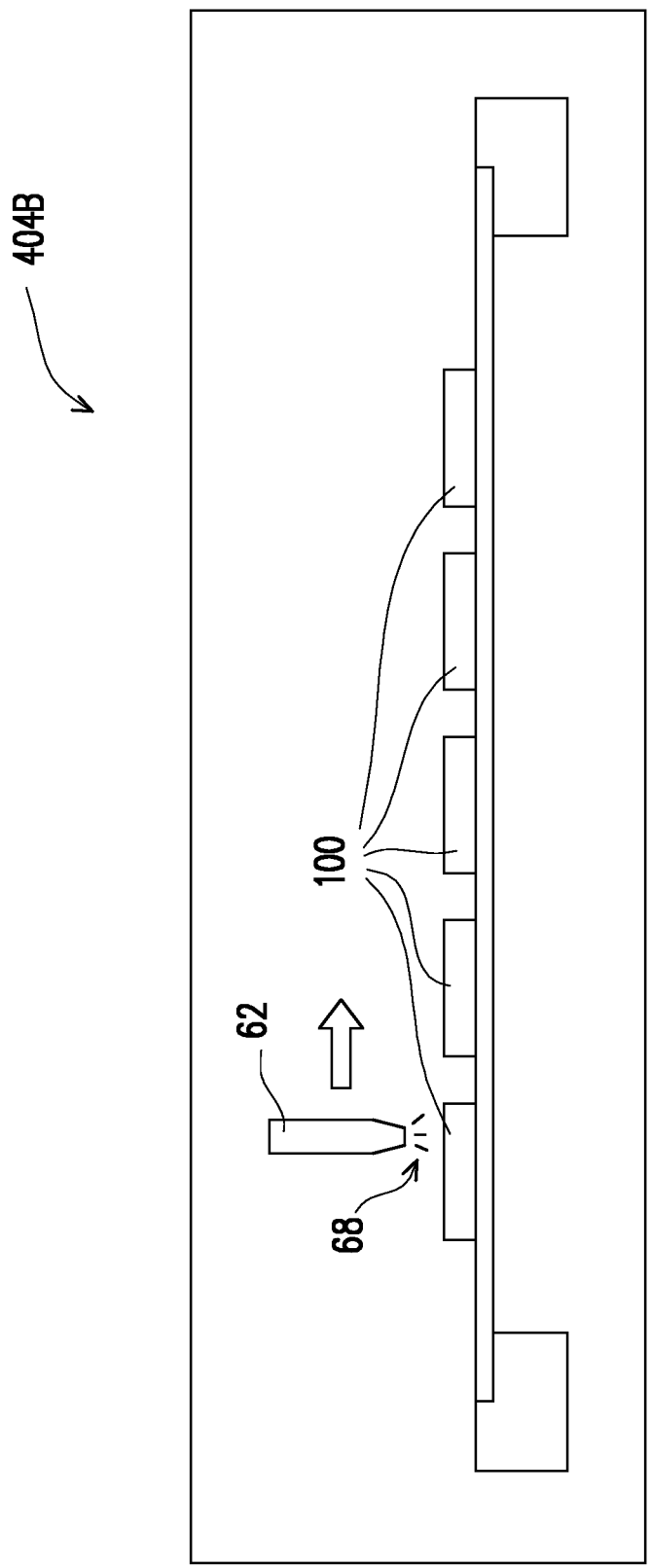
Figure 20:
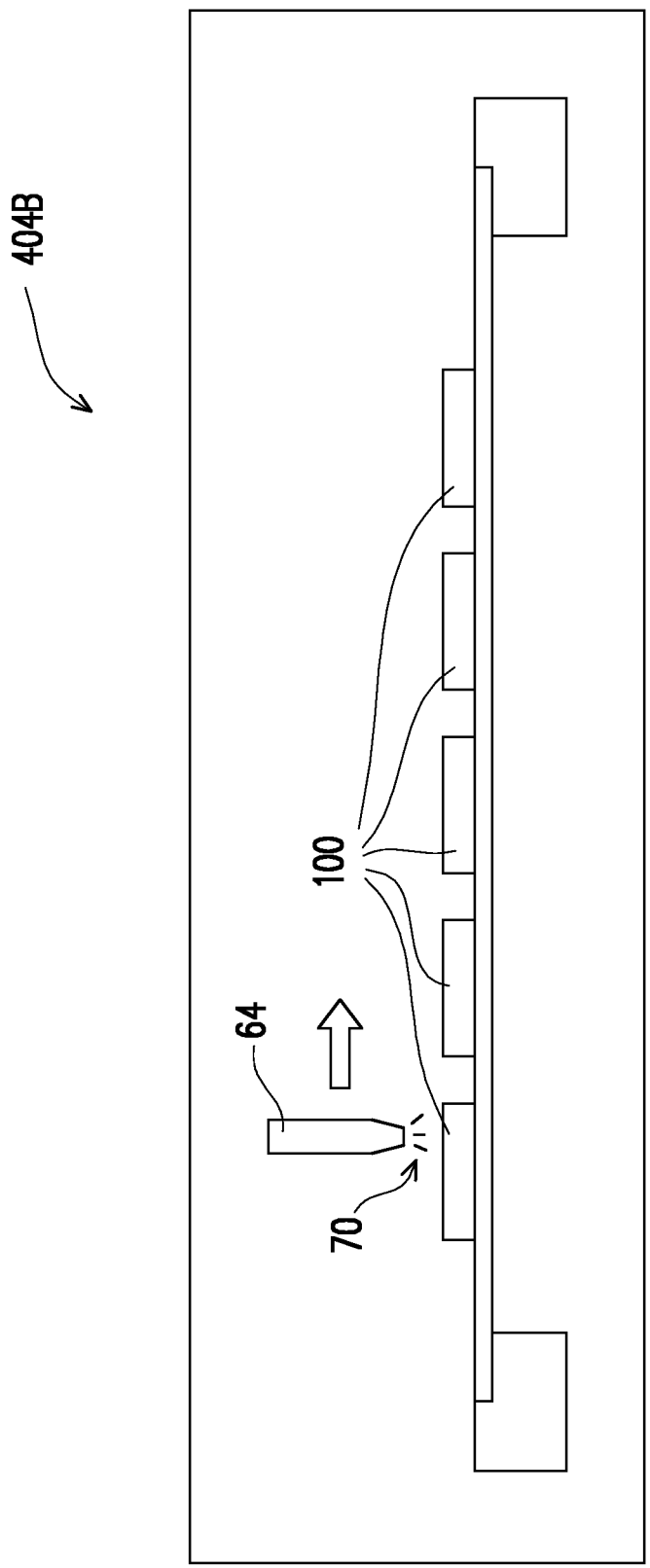

FIGS. 19 and 20 illustrate the cross-sectional views of intermediate stages in a wafer-form de-oxide process and the corresponding de-oxide module 404B in accordance with some embodiments. The respective de-oxide process is also illustrated as process 302 as shown in FIG. 21 and by arrows 22 in FIG. 1. This process may be performed through spraying flux 68 onto package components 100 using spray nozzle 62, and heating the package components 100. The flux is activated by the heat to remove the oxides on package components 100. Spray nozzle 62 scans through all package components 100, so that all of package components 100 are sprayed with the flux 68. In accordance with some embodiments of the present disclosure, after all package components 100 are sprayed with the flux, package components 100 are heated to a temperature in the range between about 60° C. and about 70° C. The heating duration may be in the range between about 30 seconds and about 5 minutes. After the heating, as shown in FIG. 20, spray nozzle 64 scans through all package components 100 again and spray cleaning fluid 70, which may be de-ionized water or a chemical solution, so that the residue of the flux is removed.

The wafer-form de-oxide process may be performed using any of the apparatus and processes in FIGS. 15A and 15B, FIGS. 16A and 16B, FIG. 17, FIG. 18, and FIGS. 19 and 20. After the wafer-form de-oxide process, package components 100 are picked up by pickup module 402 (FIG. 14). An alignment is then performed to align package component 100 with the underlying package component 200 (refer to FIG. 4). The alignment is performed by the alignment module 406 (FIG. 14). Next, the placement module 408 as shown in FIG. 14 places package component 100 on package component 200 (refer to FIGS. 4 and 8). The pick-and-place process is repeated, so that a plurality of package components 100 are placed on a plurality of package components 200. An anneal/reflow process is then performed to bond package components 100 with package components 200.

The embodiments of the present disclosure have some advantageous features. By performing the de-oxide process before the placement and the bonding of package components, the bonded package components do not need to be cleaned to remove the residue of flux. This advantageously improves the reliability of some packages because some of the packages, due to their structures, are difficult to have the flux residue removed. Also, the embodiments of the present disclosure solve the problem that forming gas (if used) cannot be conducted to electrical connectors to de-oxide during the bonding process.

In accordance with some embodiments of the present disclosure, a method includes picking up a first package component; removing an oxide layer on an electrical connector of the first package component; after the oxide layer is removed, placing the first package component on a second package component; and bonding the first package component to the second package component. In an embodiment, the method further includes transferring the first package component to the second package component, wherein the removing the oxide layer is performed during a period of time when the first package component is transferred to the second package component. In an embodiment, the removing the oxide layer comprises: generating plasma from a forming gas; and after the first package component is picked up and before the first package component is placed on the second package component, treating the first package component with the plasma. In an embodiment, the removing the oxide layer comprises: bringing the first package component close to the second package component; and injecting a plasma of a forming gas into a gap between the first package component and the second package component. In an embodiment, the removing the oxide layer comprises: scanning the first package component and a plurality of additional package components with a plasma of a forming gas, wherein the first package component is identical to the plurality of additional package components. In an embodiment, the removing the oxide layer comprises: before the first package component is picked up, treating the first package component and a plurality of additional package components with a plasma of a forming gas, wherein the first package component and the plurality of additional package components are treated simultaneously in a vacuum environment. In an embodiment, the removing the oxide layer comprises: before the first package component is picked up, treating the first package component and a plurality of additional package components with a vapor-phase reductant, wherein the first package component and the plurality of additional package components are treated simultaneously in a negative-pressure environment. In an embodiment, the removing the oxide layer comprises: spraying the first package component and a plurality of additional package components with a flux; heating the first package component and the plurality of additional package components simultaneously to remove the oxide layer; and cleaning a residue of the flux.

In accordance with some embodiments of the present disclosure, a method includes picking up a first package component; transporting the first package component toward a second package component; with the first package component being picked up, removing a metal oxide layer on a surface of an electrical connector of the first package component; after the metal oxide layer is removed, placing the first package component onto the second package component; and heating the first package component and the second package component to bond the first package component to the second package component. In an embodiment, the removing the metal oxide layer comprises: conducting a plasma of a forming gas to the metal oxide layer to reduce the metal oxide layer back to metal. In an embodiment, the removing the oxide layer comprises: stopping movement of the first package component, with the plasma being conducted to the metal oxide layer when the first package component is kept still. In an embodiment, the removing the oxide layer comprises conducting the plasma to the metal oxide layer when the first package component is moving. In an embodiment, the method further includes moving a plasma output device along with the first package component to conduct the plasma to the metal oxide layer when the first package component is moving. In an embodiment, the first package component is picked up using a vacuum head, and the oxide layer is removed when the first package component is on the vacuum head.

In accordance with some embodiments of the present disclosure, an apparatus configured to bond a first package component to a second package component includes a pickup module configured to pick up the first package component; a de-oxide module configured to remove an oxide layer from the first package component; an alignment module configured to align the first package component to the second package component; and a placement module configured to place the first package component on the second package component. In an embodiment, the apparatus further includes a controller signally connected to, and is configured to control operations of, the pickup module, the de-oxide module, the alignment module, and the placement module. In an embodiment, the de-oxide module comprises a plasma output device configured to output plasma toward the first package component. In an embodiment, the plasma output device is configured to output the plasma toward the first package component after the first package component is picked up. In an embodiment, the plasma output device is configured to output the plasma when moving in a mode synchronized with a movement of the first package component. In an embodiment, the de-oxide module is configured to perform a de-oxide operation on a plurality of package components.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus configured to bond a first package component to a second package component, the apparatus comprising:
    a pickup module configured to pick up the first package component;
    a de-oxide module configured to remove an oxide layer from the first package component, wherein the de-oxide module comprises a plasma output device, and the plasma output device comprises:
        a plasma channel;
        an exhaust channel encircling the plasma channel; and
        an inert gas channel encircling the exhaust channel;
    an alignment module configured to align the first package component to the second package component; and
    a placement module configured to place the first package component on the second package component.

2. The apparatus of claim 1 further comprising a controller signally connected to, and is configured to control operations of, the pickup module, the de-oxide module, the alignment module, and the placement module.

3. The apparatus of claim 2, wherein the controller is configured to control the de-oxide module to remove the oxide layer from the first package component at a time after the first package component is picked up.

4. The apparatus of claim 3, wherein the controller is further configured to control the de-oxide module to remove the oxide layer from the first package component at the time before the first package component is placed on the second package component.

5. The apparatus of claim 2, wherein the controller is configured to control the de-oxide module to remove the oxide layer from the first package component when the first package component is being moved by the pickup module.

6. The apparatus of claim 2, wherein the controller is configured to control the de-oxide module to remove the oxide layer from the first package component, and is spaced apart from, the second package component.

7. The apparatus of claim 1, wherein the de-oxide module is configured to perform a de-oxide operation on a plurality of package components simultaneously.

8. The apparatus of claim 1 further comprising a Radio Frequency (RF) generator electrically connected to the plasma output device.

9. An apparatus configured to bond a first package component to a second package component, the apparatus comprising:
    a pickup head configured to:
        pick up the first package component; and
        transfer the first package component along a path connecting the first package component to the second package component;
    a plasma generator comprising an output device, wherein the output device is positioned at a location close to the path, and the plasma generator is configured to reduce metal oxide layers on electrical connectors of the first package component back to metal; and
    an alignment module configured to align the first package component to the second package component.

10. The apparatus of claim 9, wherein the pickup head is configured to move along the path.

11. The apparatus of claim 9, wherein the output device is movable, and wherein the apparatus further comprises a controller configured to synchronize movement of the output device and the pickup head to move together.

12. The apparatus of claim 9, wherein the plasma generator and the output device are configured to de-oxidize the first package component when the first package component is transferred to the second package component.

13. The apparatus of claim 9 further comprising a controller configured to control the plasma generator and the output device to de-oxidize both of the first package component and the second package component.

14. The apparatus of claim 13, wherein the controller is configured to control the plasma generator and the output device to de-oxidize both of the first package component and the second package component when the first package component has been moved to directly over the second package component.

15. An apparatus configured to bond a first package component to a second package component, the apparatus comprising:
a pickup head configured to pick up the first package component, and transfer the first package component along a path connecting the first package component to the second package component;
a Radio-Frequency (RF) generator configured to generate a plasma;
an output device connected to the RF generator, wherein the output device is configured to output the plasma;
an alignment module configured to align the first package component to the second package component; and
a controller signally connected to the pickup head, the RF generator, and the alignment module, wherein the controller is configured to control the pickup head and the output device to de-oxidize the first package component when the first package component is being transferred.

16. The apparatus of claim 15, wherein the output device is fixed in a position, and the position is in a moving path of the pickup head.

17. The apparatus of claim 15, wherein the controller is configured to control the pickup head and the output device to move in a synchronized mode and in a same direction.

18. The apparatus of claim 15, wherein the output device is configured to output the plasma to a gap between the first package component and the second package component, so that both of first electrical connectors of the first package component and second electrical connectors of the second package component are de-oxidized at a same time.

19. The apparatus of claim 18, wherein the output device is configured to output the plasma that is configured to reduce native oxides on the first electrical connectors and the second electrical connectors back to metals.

20. The apparatus of claim 1, wherein the de-oxide module is configured to output a plasma that is configured to reduce native oxides on first electrical connectors of the first package component back to a metal.

* * * * *